United States Patent
Lu et al.

(10) Patent No.: US 10,504,939 B2
(45) Date of Patent: Dec. 10, 2019

(54) INTEGRATION OF SILICON THIN-FILM TRANSISTORS AND METAL-OXIDE THIN FILM TRANSISTORS

(71) Applicant: The Hong Kong University of Science and Technology, Kowloon (HK)

(72) Inventors: Lei Lu, Kowloon (HK); Wei Zhou, New Territories (HK); Man Wong, New Territories (HK); Hoi Sing Kwok, New Territories (HK)

(73) Assignee: The Hong Kong University of Science and Technology, Kowloon (HK)

( * ) Notice: Subject to any disclaimer, the term of this patent is extended or adjusted under 35 U.S.C. 154(b) by 44 days.

(21) Appl. No.: 15/899,995

(22) Filed: Feb. 20, 2018

(65) Prior Publication Data

US 2018/0240821 A1 Aug. 23, 2018

Related U.S. Application Data

(60) Provisional application No. 62/600,281, filed on Feb. 21, 2017.

(51) Int. Cl.
*H01L 27/12* (2006.01)
*H01L 29/786* (2006.01)
(Continued)

(52) U.S. Cl.
CPC ........ *H01L 27/1251* (2013.01); *H01L 27/127* (2013.01); *H01L 27/1225* (2013.01);
(Continued)

(58) Field of Classification Search
CPC ............. H01L 27/1251; H01L 29/7869; H01L 29/78648
See application file for complete search history.

(56) References Cited

U.S. PATENT DOCUMENTS

| 5,414,283 A | 5/1995 | den Boer et al. |
| 5,757,028 A | 5/1998 | Sasaki et al. |

(Continued)

FOREIGN PATENT DOCUMENTS

| CN | 102646718 A | 8/2012 |
| CN | 103311128 A | 9/2013 |

(Continued)

OTHER PUBLICATIONS

Rha et al., "Vertically integrated submicron amorphous-In2Ga2ZnO7 thin film transistor using a low temperature Process," 2012, Applied Physics Letters, American Institute of Physics, 6 pages.

(Continued)

*Primary Examiner* — Changhyun Yi
(74) *Attorney, Agent, or Firm* — Amin, Turocy & Watson, LLP

(57) ABSTRACT

This disclosure relates generally to the three-dimensional (3D) integrated thin-film transistors (TFTs) with silicon and metal-oxide (MO) semiconductors as the active layers. In one or more embodiments, an apparatus is provided that comprises a first transistor comprising a silicon active layer, and a second transistor comprising a metal oxide active layer. The second transistor is vertically stacked on the first transistor, and the first transistor and the second transistor share a gate electrode formed between the silicon active layer and the metal oxide active layer. With these embodiments, the gate electrode corresponds to a top gate of the first transistor and a bottom gate of the second transistor.

20 Claims, 16 Drawing Sheets

(51) Int. Cl.
    *H01L 21/266*     (2006.01)
    *H01L 27/32*     (2006.01)
    *G02F 1/1368*     (2006.01)

(52) U.S. Cl.
    CPC ...... *H01L 27/1288* (2013.01); *H01L 29/7869* (2013.01); *H01L 29/78675* (2013.01); *G02F 1/1368* (2013.01); *G02F 2001/13685* (2013.01); *G02F 2202/104* (2013.01); *H01L 21/266* (2013.01); *H01L 27/3262* (2013.01); *H01L 29/78618* (2013.01); *H01L 29/78696* (2013.01)

(56) References Cited

U.S. PATENT DOCUMENTS

| | | | |
|---|---|---|---|
| 5,903,014 | A | 5/1999 | Ino et al. |
| 6,410,961 | B1 | 6/2002 | Hayashi |
| 6,429,457 | B1 | 8/2002 | Berggren et al. |
| 6,451,636 | B1 | 9/2002 | Segawa et al. |
| 6,486,514 | B2 | 11/2002 | Jeong et al. |
| 6,628,363 | B1 | 9/2003 | Sano et al. |
| 7,132,687 | B2 | 11/2006 | Kawasaki et al. |
| 7,211,825 | B2 | 5/2007 | Shih et al. |
| 7,348,221 | B2 | 3/2008 | Bromberger |
| 7,411,298 | B2 | 8/2008 | Kawakami et al. |
| 7,527,994 | B2 | 5/2009 | Sarma et al. |
| 7,696,036 | B2 | 4/2010 | Bu et al. |
| 7,897,445 | B2 | 3/2011 | Chang et al. |
| 7,977,750 | B2 | 7/2011 | Kitakado et al. |
| 7,993,964 | B2 | 8/2011 | Hirao et al. |
| 8,067,772 | B2 | 11/2011 | Ikeda et al. |
| 8,367,489 | B2 | 2/2013 | Yamazaki |
| 8,759,917 | B2 | 6/2014 | Park et al. |
| 8,841,665 | B2 | 9/2014 | Park et al. |
| 9,230,985 | B1 | 1/2016 | Wu et al. |
| 9,401,430 | B1 | 7/2016 | Ellinger et al. |
| 9,564,478 | B2 | 2/2017 | Chang et al. |
| 2004/0086807 | A1 | 5/2004 | Peng et al. |
| 2004/0099863 | A1* | 5/2004 | Chen .............. H01L 27/1255 257/66 |
| 2005/0270259 | A1 | 12/2005 | Shirasaki et al. |
| 2006/0175609 | A1 | 8/2006 | Chan et al. |
| 2006/0214198 | A1 | 9/2006 | Matsuki et al. |
| 2006/0267100 | A1* | 11/2006 | Noguchi ............ H01L 21/84 257/351 |
| 2007/0034871 | A1 | 2/2007 | Itoh et al. |
| 2007/0281400 | A1 | 12/2007 | Yamazaki et al. |
| 2008/0136990 | A1 | 6/2008 | Kimura |
| 2008/0277657 | A1 | 11/2008 | Jeong et al. |
| 2010/0181575 | A1 | 7/2010 | Makita et al. |
| 2011/0049511 | A1 | 3/2011 | Yano et al. |
| 2011/0062433 | A1 | 3/2011 | Yamazaki |
| 2011/0095288 | A1 | 4/2011 | Morosawa et al. |
| 2012/0161124 | A1 | 6/2012 | Yamazaki et al. |
| 2013/0077012 | A1 | 3/2013 | Tada |
| 2013/0153890 | A1* | 6/2013 | Yoneda .............. H01L 27/1225 257/43 |
| 2013/0181214 | A1 | 7/2013 | Yamazaki et al. |
| 2014/0015067 | A1 | 1/2014 | Ranade et al. |
| 2014/0103307 | A1 | 4/2014 | Chang et al. |
| 2014/0138682 | A1 | 5/2014 | Saito et al. |
| 2014/0151708 | A1 | 6/2014 | Jeon et al. |
| 2014/0252454 | A1 | 9/2014 | Rabkin et al. |
| 2015/0069320 | A1 | 3/2015 | Rabkin et al. |
| 2015/0179811 | A1 | 6/2015 | Kanno et al. |
| 2015/0221775 | A1 | 8/2015 | Yamazaki et al. |
| 2015/0311256 | A1 | 10/2015 | Rabkin et al. |
| 2016/0233338 | A1 | 8/2016 | Lu et al. |
| 2016/0351722 | A1 | 12/2016 | Zhou et al. |

FOREIGN PATENT DOCUMENTS

| | | |
|---|---|---|
| CN | 103426740 A | 12/2013 |
| CN | 104332485 A | 2/2015 |
| CN | 105408813 A | 3/2016 |
| TW | 201334083 A | 8/2013 |

OTHER PUBLICATIONS

Wu et al., "High performance InGaZnO thin film transistor with InGaZnO source and drain electrodes," Applied Physics Letters, 2013, vol. 102, American Institute of Physics, 5 pages.

Woon et al., "Vertical organic field effect phototransistor with two dissimilar source and drain contacts," Thin Solid Films, 2014, pp. 525-529, vol. 562, Elsevier, 5 pages.

Park et al., "Improvements in the device characteristics of amorphous indium gallium zinc oxide thin-film transistors by Ar plasma treatment," Applied Physics Letters, 2007, vol. 90, American Institute of Physics, 3 pages.

Kim et al., "High mobility bottom gate InGaZnO thin film transistors with Si O x etch stopper," Applied Physics Letters, 2007, vol. 90, American Institute of Physics, 4 pages.

Park et al., "Review of recent developments in amorphous oxide semiconductor thin-film transistor devices," Thin Solid Films, 2012, pp. 1679-1693, vol. 520, Elsevier, 15 pages.

Chen et al., "Self-Aligned Indium-Gallium-Zinc Oxide Thin-Film Transistor With Phosphorus-Doped Source/Drain Regions," IEEE Electron Device Letters, Aug. 2012, pp. 1150-1152, vol. 33, No. 8, IEEE, 3 pages.

Sato et al., "Amorphous In—Ga—Zn—O thin-film transistor with coplanar homojunction structure," Thin Solid Films, 2009, pp. 1309-1313, vol. 518, Elsevier, 5 pages.

Li et al., "Effect of thermal annealing on the properties of transparent conductive In—Ga—Sn oxide thin films," Journal of Vacuum Science & Technology A, 2014, vol. 32, No. 2, American Vacuum Society, 7 pages.

Kamiya et al., "Origins of High Mobility and Low Operation Voltage of Amorphous Oxide TFTs: Electronic Structure, Electron Transport, Defects and Doping," Journal of Display Technology, Jul. 2009, pp. 273-288, vol. 5, No. 7, 17 pages.

Ahn et al., "Comparison of the effects of Ar and H2 plasmas on the performance of homojunctioned amorphous indium gallium zinc oxide thin film transistors," Applied Physics Letters, 2008, vol. 93, American Institute of Physics, 4 pages.

Chen et al., "Self-aligned indium-gallium-zinc oxide thin-film transistors with SiNx/SiO2/SiNx/SiO2 passivation layers," Thin Solid Films, 2014, pp. 397-400, vol. 564, Elsevier, 4 pages.

Kwon et al., "Bottom-Gate Gallium Indium Zinc Oxide Thin-Film Transistor Array for High-Resolution AMOLED Display", IEEE Electron Device Letters, 2008, pp. 1309-1311, vol. 29, No. 12, IEEE, 3 pages.

Na et al., "High field-effect mobility amorphous InGaZnO transistors with aluminum electrodes," Applied Physics Letters, 2008, vol. 93, No. 6, American Institute of Physics, 4 pages.

Jeong et al., "12.1-in. WXGA AMOLED display driven by InGaZnO thin-film transistors," Journal of the Society for Information Display, 2009, pp. 95-100, vol. 17, No. 2, Society for Information Display, 6 pages.

Kim et al., "An investigation of contact resistance between metal electrodes and amorphous gallium-indium-zinc oxide (a-GIZO) thin-film transistors," Thin Solid Films, 2010, pp. 6357-6360, vol. 518, No. 22, Elsevier, 4 pages.

Tsai et al., "Influence of positive bias stress on N2O plasma improved InGaZnO thin film transistor," Applied Physics Letters, 2010, vol. 96, No. 24, American Institute of Physics, 3 pages.

Ono et al., "Thin film transistors using PECVD-grown carbon nanotubes," Nanotechnology, 2010, vol. 21, IOP Publishing Ltd, 5 pages.

Ryu et al., "Amorphous-InGaZnO4 Thin-Film Transistors with Damage-Free Back Channel Wet-Etch Process," ECS Solid State Letters, 2012, vol. 1, No. 2, 3 pages.

(56) References Cited

OTHER PUBLICATIONS

Park et al., "High-Performance Low-Cost Back-Channel-Etch Amorphous Gallium-Indium-Zinc Oxide Thin-Film Transistors by Curing and Passivation of the Damaged Back Channel," 2013, ACS Applied Materials & Interfaces, vol. 5, No. 23, pp. 12262-12267, American Chemical Society, 6 pages.

Um et al., "P-7: High Speed a-IGZO TFT-based Gate Driver by using Back Channel Etched Structure," SID Digest, Jun. 2014, pp. 968-971, vol. 45, No. 1, 4 pages.

Hino et al., "Effects of thermal annealing on variations of electron traps in the channel region of amorphous In—Ga—Zn—O thin film transistor," Journal of Vacuum Science & Technology B, 2014, vol. 32, No. 3, American Vacuum Society, 7 pages.

Kamiya et al., "Present status of amorphous In—Ga—Zn—O thin-film transistors," Science and Technology of Advanced Materials, 2010, vol. 11, No. 4, IOP Publishing, 23 pages.

Office Action dated Jan. 23, 2017 for U.S. Appl. No. 14/671,055, 13 pages.

Office Action dated Jun. 26, 2017 for U.S. Appl. No. 14/671,055, 13 pages.

Office Action dated Mar. 21, 2016 for U.S. Appl. No. 14/671,055, 12 pages.

Office Action dated Aug. 9, 2016 for U.S. Appl. No. 14/671,055, 10 pages.

Office Action dated Oct. 19, 2015 for U.S. Appl. No. 14/671,055, 21 pages.

Jin, et al., "Simple Fabrication of a Three-Dimensional CMOS Inverter Using p-Type Poly-Si and n-Type Amorphous Ga—In—Zn—O Thin-Film Transistors," IEEE Electron Device Letters, vol. 32, No. 9, Sep. 2011, 3 pages.

Kamiya, et al., "Present status of amorphous In—Ga—Zn—O thin-film transistors," Sci. Technol. Adv. Mater. 11 (2010) 044305, 23 pages.

Lih, et al., "Comparison of a-Si and Poly-Si for AMOLED displays," J. Soc. Inf. Disp. 12, 367 (2004), 5 pages.

Office Action dated Mar. 12, 2018 for U.S. Appl. No. 15/581,322, 81 pages.

\* cited by examiner

INTEGRATION OF SILICON THIN-FILM TRANSISTORS AND METAL-OXIDE THIN FILM TRANSISTORS

RELATED APPLICATION

This application claims priority to U.S. Provisional Patent Application No. 62/600,281, filed on Feb. 21, 2017, and entitled "INTEGRATION OF SILICON THIN-FILM TRANSISTORS AND METAL-OXIDE THIN FILM TRANSISTORS." The entirety of the aforementioned application is incorporated by reference herein.

TECHNICAL FIELD

This disclosure relates generally to the three-dimensional (3D) integrated thin-film transistors (TFTs) with silicon and metal-oxide (MO) semiconductors as the active layers.

BACKGROUND

Flat panel displays (FPDs), including active-matrix liquid crystal displays (AMLCDs) and active-matrix organic light emitting diode (AMOLED) displays, are becoming vital in modern information exchange and communication processes. Thin-film transistors (TFTs) are the essential active devices of the active-matrix backplane. The TFTs control the on/off switching of the light for each pixel of a FPD. The resolution of an FPD is characterized by the number of pixels per inch (ppi). A higher ppi value implies smaller pixel size and thus a smaller TFT size per pixel. The preferred ppi highly depends on the specific application of the FPD. For example, modern smartphones usually require a ppi greater than 300 for both AMLCD and AMOLED panels. For near-eye applications, such as augmented reality (AR) and virtual reality (VR) application, a ppi greater than 500 ppi (and up to about 1000 ppi) is theoretically preferred to prevent a grainy effect.

The downscaling of the TFT pixel becomes quite challenging for FPDs with pixel densities beyond 600 ppi due to several hindering factors. In particular, the resolution of the photolithography tools used to form the TFT pixel determines the minimum line width and space in TFT panels, which thereby controls the maximum ppi for a FPD. The smallest resolution of photolithography tools in the current FPD industry is about 2 μm, which is much poorer than that in integrated circuit (IC) industry. Accordingly, the pixel area of the FPDs is restricted by the 2 μm resolution of the photolithography tools. In addition, the driving capability of a TFT is determined by its mobility and geometric size. For lower mobility, a larger TFT, more specifically a larger width to length (W/L) ratio, is required to compensate the driving current, thus enlarging the pixel area. Further, for OLED panels, the light emitting uniformity is directly related to the uniformity of TFTs. Considering the unsatisfied uniformity of incumbent TFTs, compensation circuits are currently essential in the pixel of AMOLEDs, inevitably increasing the TFT numbers, connection lines and contact holes, and thus degrading the ppi. Furthermore, a storage capacitor is required in the pixel to hold the charges during the whole frame period. The area of the capacitor is closely related to the leakage current of TFT. A leaky TFT required a larger area capacitor. Accordingly, techniques for increasing the pixel densities of FPDs while accounting for these various hindering factors are highly desired.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
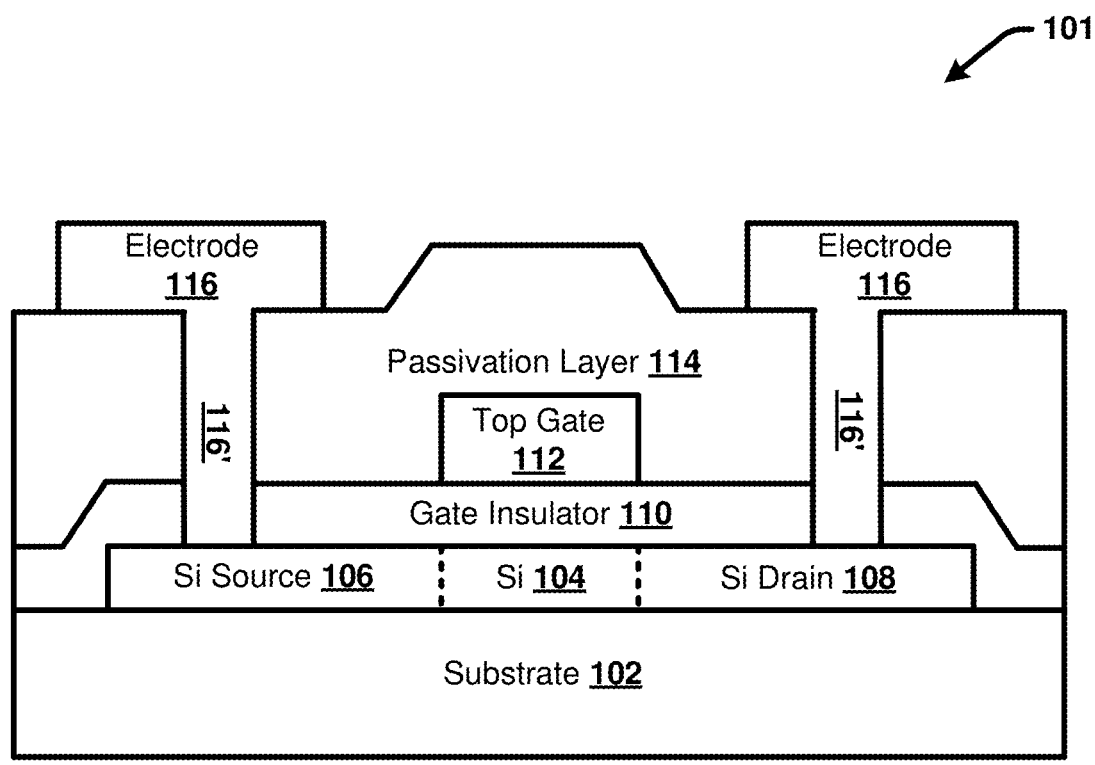
FIG. 1 presents a cross-sectional schematic of a top-gate self-aligned (TGSA), low temperature polysilicon (LTPS) thin-film transistor (TFT) in accordance with one or more aspects and embodiments the disclosed subject matter.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of this disclosure may be practiced without these specific details, or with other methods, components, materials, etc. In other instances, well-known structures and devices are shown in block diagram form to facilitate describing the subject disclosure.

By way of introduction, the subject matter disclosed herein relates to 3D integrated TFT structures that combine both a silicon active layer TFT and a MO active layer TFT in a stacked manner. The resulting transistor structures provide a powerful two transistors and one capacitor (2T1C) backbone for FPDs, particularly OLED and AMOLED displays, while reducing the pixel area and increasing the ppi.

Metal oxide (MO) TFTs and low temperature polysilicon (LTPS) TFTs are two mainstream technologies for high-resolution FPDs. The MO TFT and the LTPS TFT have differing benefits and drawbacks when applied to high-resolution FPDs. For example, the LTPS TFT exhibits larger mobility and thus better current drive capability over the MO TFT, and is also more reliable under stress. The LTPS TFT can also be made into both n-type and p-type, compatible with complementary metal-oxide-semiconductors (CMOS)s, making it more suitable for circuit applications relative to the MO TFT. On the other hand, MO TFTs demonstrates good uniformity, low leakage current and are associated with a much lower fabrication cost. However, since most MO materials are n-type, the lack of p-type metal-oxide semiconductors (PMOS)s limits the properties of logic circuit fabrication based on MO TFTs.

The subject TFT structures combine the LTPS TFT and the MO TFT in a single structure in a manner that provides the benefits of both the LTPS TFT and the MO TFT for application in high resolution displays while saving the layout area and reducing the pixel size of the active matrix display. In particular, the disclosed transistor structures integrate an MO TFT and a LTPS TFTs in a 3D stacked manner, by partially stacking a portion of the MO TFT over a portion of the LTPS TFT. The stacking is characterized as being 3D because the MO TFT is stacked over the LTPS TFT in a vertical direction, (as opposed to a planar arrangement wherein the respective TFTs are arranged on a same plane). The way the MO TFT is stacked over the LTPS TFT results in usage the gate electrode, source region or drain region of one of the TFTs as the gate electrode for the other TFT. In this regard, in some embodiments, the active layer (e.g., the MO channel region) of the MO TFT can be stacked over the top-gate of the LTPS TFT. With these embodiments, the top-gate electrode of the LTPS TFT can also serve as the bottom-gate electrode for the MO TFT. In other embodiments, the active layer of the MO TFT (e.g., the MO channel region) can be stacked over either the source region or the drain region of the LTPS TFT. With these embodiments, the source region or the drain region of the LTPS TFT can also serve as the bottom-gate electrode for the MO TFT. In one or more additional embodiments, the source region or the drain region of the MO TFT can be stacked over the silicon (Si) active layer (e.g., the Si channel region) of the LTPS TFT. With these embodiments, the source region or the drain region of the MO TFT can also serve as the top-gate electrode for the LTPS TFT.

Because the various transistor structures disclosed herein partially stack a MO TFT on a LTPS-TFT, the proposed technology is named Metal Oxide on Silicon (MOOS). The disclosed transistor structures are therefore hereinafter referred to as MOOS transistor structures. The 3D stacking design of the MOOS transistor structure overcomes the planar limitation set by the photolithography resolution, significantly reducing the pixel area and enabling high-ppi displays. In addition, by sharing the gate electrode, source region or drain region of one of the TFTs as the gate electrode for the other TFT, some contact holes for the interconnection between the respective TFTs can be saved, further reducing pixel area and increasing ppi. Further, because the disclosed MOOS transistor structures can include both n-type MO TFTs and p-type LTPS TFTs, complementary metal-oxide-semiconductor (CMOS) circuits can be realized readily with fewer mask account than CMOS solely based on n/p-type LTPS TFTs. As a result, not only smaller pixels but also low-cost driving circuits can be integrated into display panels. Accordingly, the disclosed MOOS transistor structures enable energy saving FPDs with higher ppis and resolutions at lower cost by combining the merits of both MO TFTs and LTPS TFTs. The subject MOOS transistor structures can be employed in various types of display panels and can provide important applications in ultra-high-resolution displays, such as high-end smart phones, augmented reality (AR) displays, and virtual reality (VR) displays.

In one or more embodiments, an apparatus is provided that comprises a first transistor comprising a silicon active layer, and a second transistor comprising a metal oxide active layer. The second transistor is vertically stacked on the first transistor, and the first transistor and the second transistor share a gate electrode formed between the silicon active layer and the metal oxide active layer. With these embodiments, the gate electrode corresponds to a top gate of the first transistor and a bottom gate of the second transistor. In some implementations, the apparatus can further include a circuit comprising the first transistor and the second transistor, and a flat panel display comprising pixels communicatively coupled to the circuit, wherein the first transistor and the second transistor structure are configured to control electrical operation of a single pixel of the pixels. According to these implementations, wherein the first transistor can comprise a p-type TFT and the second transistor can comprise a n-type TFT, and wherein the circuit comprises a CMOS circuit. In one implementation, the flat panel display further comprises a pixel density greater than 1000 ppi and wherein the circuit pixel area conforms to design rules including a minimum photolithography size of 2.0 μm and a minimum transistor width to length ratio of 2.0 μm/2.0 μm.

In another embodiment, an apparatus is provided that comprises a first transistor comprising a silicon active layer, wherein the silicon active layer comprises a source region, a drain region, and a channel region formed between the source region and the drain region. The apparatus further comprises a second transistor comprising a metal oxide active layer, wherein the metal oxide active layer is vertically stacked on either the source region or the drain region. In this regard, based on the metal oxide active layer being vertically stacked on the source region, the source region is configured to operate as both an electrical current source for the first transistor and a bottom gate for the second transistor. Likewise, based on the metal oxide active layer being vertically stacked on the drain region, the drain region is configured to operate as both an electrical current drain for the first transistor and a bottom gate for the second transistor.

Still in yet another embodiment, an apparatus is provided that comprises a first transistor comprising a silicon active layer, wherein the silicon active layer comprises a first source region, a first drain region, and a first channel region formed between the first source region and the first drain region. The apparatus further comprises a second transistor comprising a metal oxide active layer, a second source region and a second drain region, wherein either the second source region or the second drain region is vertically stacked on the first channel region. According to this embodiment, based on the second source region being vertically stacked on the first channel region, the second source region is configured to operate as both an electrical current source for the second transistor and a top gate for the first transistor. Likewise, based on the second drain region being vertically stacked on the first channel region, the second drain region is configured to operate as both an electrical current drain for the second transistor and a top gate for the first transistor.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is to be understood that the various layers, components and/or regions (e.g., the substrate, the active layers, the gate insulator layers, the electrodes, the gates, the contact holes, etc.) shown in the accompanying drawings are not drawn to scale. Further, one or more layers and/or regions of a type commonly used in MO TFTs, LTPS TFTs, CMOSs, MOSFETs and/or other semiconductor devices may not be explicitly shown in a given drawing. This does not imply that the layers and/or regions not explicitly shown are omitted from the actual transistor devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as on, overlying, atop, on top, positioned on, or positioned atop, mean that a first element is present on a second element, wherein intervening elements may be present between the first element and the second element. As used herein, unless otherwise specified, the terms contacting, directly contacting, or the term direct contact, mean that a first element and a second element are connected without any intervening elements, such as, for example, intermediary conducting, insulating or semiconductor layers, present between the first element and the second element. As used herein, terms such as upper, lower, above, below, right, left, vertical, horizontal, planar, top, bottom, and derivatives thereof shall relate to the disclosed structures as oriented in the drawing figures. The terms directly above, directly below, aligned with, or the like, mean that a first element is present on or below a second element, wherein the first elements overlaps or underlaps the second element, and wherein intervening elements may be present between the first element and the second element.

Turning now to the drawings, FIG. 1 presents a cross-sectional schematic of a conventional TGSA-LTPS TFT, (hereinafter, LTPS TFT 101). The LTPS TFT 101 includes a silicon active layer formed on a substrate 102. The silicon active layer includes a channel region 104 formed between a source region 106 and a drain region 108. The source region 106 and the drain region 108 can respectively have a lower resistivity (or higher conductivity) relative to the channel region 104. In some implementations, this can be achieved via doping the S/D regions with suitable doping elements at a suitable concentration (e.g., n-type or p-type atoms at a concentration between $1 \times 10^{18}$ cm$^{-3}$ and $1 \times 10^{21}$ cm$^{-3}$). In various embodiments wherein the TGSA-LTPS TFT is integrated with a MO TFT to create the subject MOOS transistor structures (discussed infra), the source region 106 and the drain region 108 of the TGSA-LTPS TFT are preferably doped such that the resulting TGSA-LTPS TFT is p-type. With these implementations, the disclosed MOOS transistor structures can include both n-type MO TFTs and p-type LTPS TFTs, thereby enabling generation of CMOS circuits with fewer mask account than CMOS solely based on n/p-type LTPS TFTs.

In the embodiment shown, the silicon active layer contacts the substrate 102. In other embodiments, one or more intervening layers can be provided between the silicon active layer and the substrate 102. The substrate 102 can include various suitable materials. In some implementations, the substrate 102 can include an oxidized silicon wafer. In another implementation, the substrate 102 can include a transparent material (e.g., glass). In another implementation, the substrate 102 can include a flexible material (e.g., polymeric substrate). Other suitable materials for the substrate 102 can include but are not limited to: paper, foil, graphene oxide, graphene, plastic, polyimide, polyester, polyethylene terephthalate, polyethylene naphthalate, polyether-ether-ketone, Polydimethylsiloxane.

The LTPS TFT 101 can further include a gate insulator layer 110 formed on the silicon active layer (e.g., including the source region 106, the channel region 104 and the drain region 108). The gate insulator layer 110 can include a suitable insulating material, including but not limited to: thermal oxide, silicon oxide, silicon dioxide, silicon nitride, silicon oxynitride, aluminum oxide, hafnium oxide, zirconia, titanium oxide, zirconium silicate, zirconium aluminate, gadolinium silicate, titanium silicate, graphene oxide, polyimide, polyester, polyethylene terephthalate, polyethylene naphthalate, polyether-ether-ketone, Polydimethylsiloxane. In the embodiment shown, the gate insulator layer 110 is formed on and contacting the silicon active layer. In other embodiments, one or more intervening layers can be provided between the silicon active layer and the gate insulator layer 110. The LTPS TFT 101 further includes a top-gate 112 formed on a portion of the gate insulator layer 110. In this regard, the top-gate 112 is aligned or substantially aligned with the channel region 104 of the silicon active layer such that the top-gate is formed directly above the channel region 104. The top-gate 112 is not formed directly over at least some portions of the active silicon layer including the source region 106 and the drain region 108. In the embodiment shown, the top-gate 112 is formed on and contacting the portion of the gate insulator layer 110 that is adjacent to the channel region 104 of the silicon active layer. In other embodiments, one or more intervening layers can be provided between the top-gate 112 and the gate insulator layer 110. The top-gate 112 can be formed with a suitable conducting material, including but not limited to: one or more metals, one or more alloys, indium-tin-oxide (ITO), indium oxide, zinc oxide, tin oxide, aluminum-zinc-oxide (AZO), carbon nanotubes (CNT), graphene, conductive nanowire meshes, conductive polymers, poly-ethylenedioxythiophene, poly-ethylenedioxythiophene, poly-styrene-sulfonate, poly-dioctyl-cyclopentadithiophene. In some implementations, the top-gate 112 can be formed with a heavily doped silicon wafer. For instance, the top-gate 112 can include a silicon wafer that is doped with n-type or p-type atoms at a concentration between $1\times10^{18}$ cm$^{-3}$ and $1\times10^{21}$ cm$^{-3}$.

The LTPS TFT 101 can further include a passivation layer 114 formed over the top-gate 112 and the gate insulator layer 110. The passivation layer 114 can serve to protect the underlying layers. The passivation layer 114 can include a suitable insulating material, including but not limited to: silicon oxide, silicon dioxide, silicon nitride, silicon oxynitride, aluminum oxide, hafnium oxide, zirconia, titanium oxide, zirconium silicate, zirconium aluminate, gadolinium silicate, titanium silicate, graphene oxide, polyimide, polyester, polyethylene terephthalate, polyethylene naphthalate, polyether-ether-ketone, Polydimethylsiloxane. The LTPS TFT 101 further includes electrodes 116 formed above the passivation layer 114. The electrodes 116 can include a metal material (e.g., aluminum) are respectively electrically connected to the source region 106 and the drain region 108 via metal lines formed within contact holes 116' formed though the passivation layer 114 and the gate insulator layer 110.

Figure 2A:
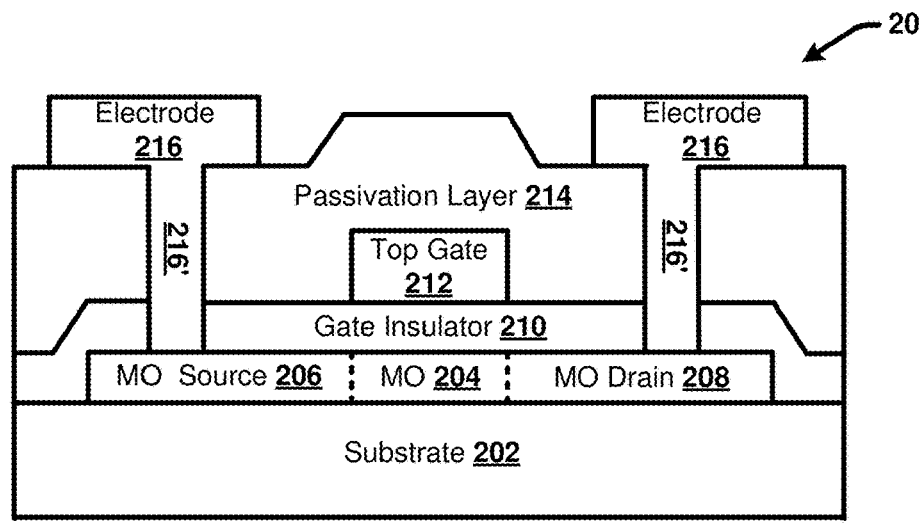
FIGS. 2A-2C present cross-sectional schematics of different types of metal-oxide (MO) TFTs in accordance with one or more aspects and embodiments the disclosed subject matter.
Figure 2B:
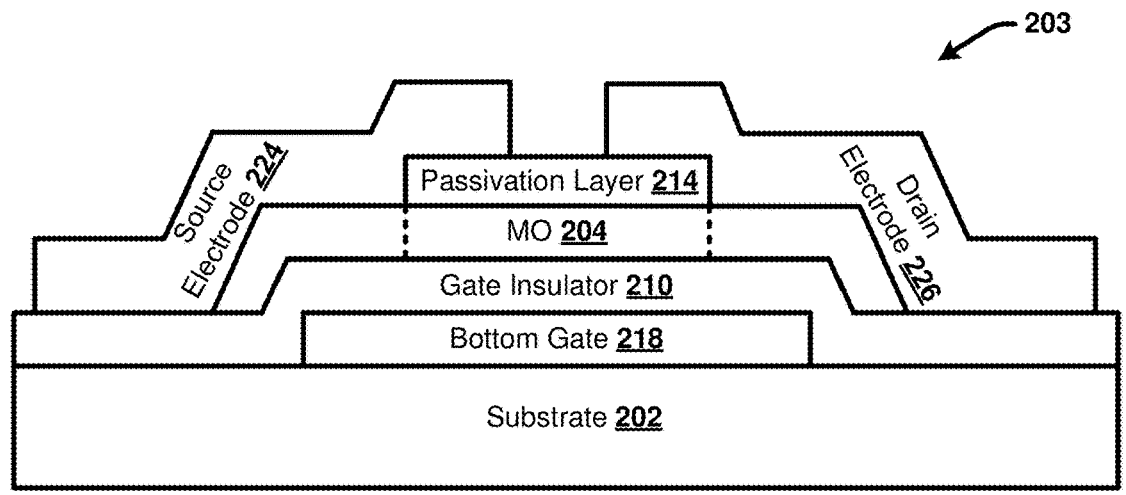
Figure 2C:
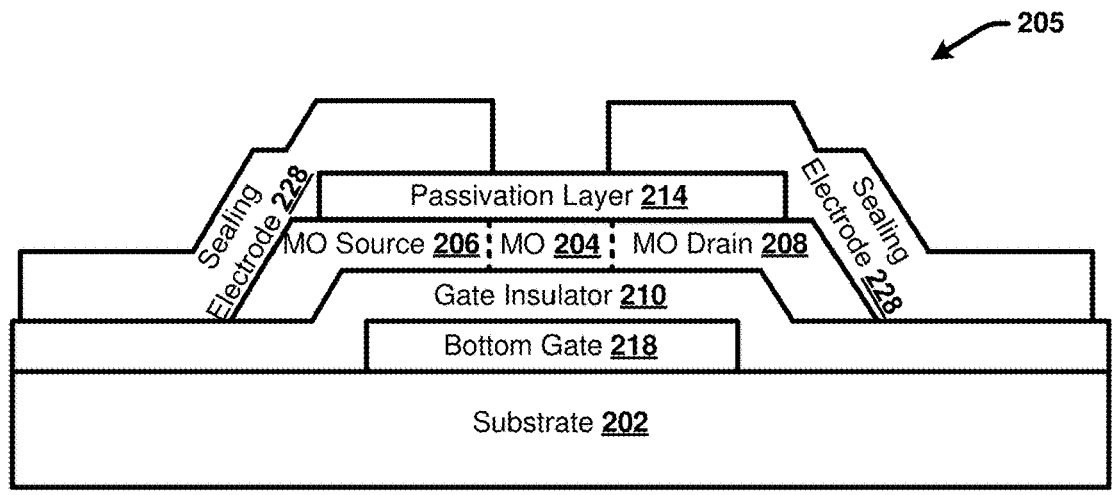

FIGS. 2A-2C respectively present cross-sectional schematics of different types of conventional MO TFTs in accordance with various embodiments described herein. For example, FIG. 2A presents a cross-sectional schematic of a TGSA-MO TFT 201. FIG. 2B presents a cross-sectional schematic of an etch-stop (ES), MO TFT, (hereinafter ES-MO TFT 203). FIG. 2C presents a cross-sectional schematic of an elevated-metal metal oxide (EMMO) TFT, hereinafter (EMMO TFT 205).

With reference to FIG. 2A, the TGSA-MO TFT 201 can include a similar structure as the LTPS TFT 101 with the usage of a MO active layer as opposed to an Si or poly-Si active layer. For example, in the embodiment shown, the TGSA-MO TFT 201 comprises an MO active layer formed on a substrate 102. The MO active layer includes a MO channel region 204 formed between a MO source region 206 and a MO drain region 208. In the embodiment shown, the MO active layer contacts the substrate 202. In other embodiments, one or more intervening layers can be provided between the MO active layer and the substrate 202. The substrate 202 can include same or similar materials as substrate 102. The metal oxide active layer (e.g., including the MO source region 206, the MO channel region 204 and the MO drain region 208) can be formed with a suitable metal oxide material. For example, some suitable metal oxides that can be used for the MO active layer can include but are not limited to: zinc oxide, zinc oxynitride, indium-zinc oxide, indium-gallium-zinc oxide, zinc-tin oxide, tin oxide, indium oxide, copper oxide, uranium oxide, bismuth oxide, barium titanate, strontium titanate, and lithium niobate. In an exemplary embodiment, the MO active layer includes zinc oxide (ZnO$_x$) or indium gallium zinc oxide (IGZO).

In one or more embodiments, the resistivity's of the MO source region 206 and the MO drain region 208 are lower than the resistivity of the MO channel region 204. In some implementations, this can be achieved via doping the S/D regions with suitable n-type doping elements at a suitable concentration (e.g., n-type or p-type atoms at a concentration between $1\times10^{18}$ cm$^{-3}$ and $1\times10^{21}$ cm$^{-3}$). In other embodiments, the resistivity's of the MO source region 206 and the MO drain region 208 can be controlled without doping or with very low doping concentrations. In particular, the MO source region 206 and the MO drain region 208 can be made highly conductive without the need of a deliberate doping process, such as plasma treatment or ion implantation. This can be accomplished by capping the S/D regions of the MO active layer with a gas-impermeable cover and capping the MO channel region 204 with a gas permeable cover (or left exposed) and performing an annealing process (e.g., thermal processing) under an oxidizing ambience or a non-oxidizing ambience. This process reduces the initial conductivity of the channel region while increasing the initial conductivity of the S/D region, thus increasing the performance of the device.

The TGSA-MO TFT 201 can further include a gate insulator layer 210 formed on the MO active layer (e.g., including the source region 206, the channel region 204 and the drain region 208). The gate insulator layer 210 can include same or similar materials as gate insulator layer 110. In the embodiment shown, the gate insulator layer 210 is formed on and contacting the MO active layer. In other embodiments, one or more intervening layers can be provided between the MO active layer and the gate insulator layer 210. The TGSA-MO TFT 201 further includes a top-gate 212 formed on a portion of the gate insulator layer 210. In this regard, the top-gate 212 is aligned or substantially aligned with the channel region 204 of the MO active layer such that the top-gate 212 is formed directly above the channel region 204. The top-gate 212 can include same or similar materials as the top-gate 112. The top-gate 212 is not formed directly over at least some portions of the MO active layer including the source region 206 and the drain region 208. In the embodiment shown, the top-gate 212 is formed on and contacting the portion of the gate insulator layer 210 that is adjacent to the channel region 204 of the MO active layer. In other embodiments, one or more intervening layers can be provided between the top-gate 212 and the gate insulator layer 210. The top-gate 212 can be formed with a same or similar metal as top-gate 112.

The TGSA-MO TFT 201 can further include a passivation layer 214 formed over the top-gate 212 and the gate insulator layer 210. The passivation layer 214 can include same or similar materials as passivation layer 114. The TGSA-MO TFT 201 further includes electrodes 216 formed above the passivation layer 214. The electrodes 216 are respectively electrically connected to the source region 206 and the drain region 208 via metal lines formed within contact holes 216' formed though the passivation layer 214 and the gate insulator layer 210.

FIG. 2B presents a cross-sectional schematic of an ES-MO TFT 203. The ES-MO TFT can include a bottom gate 218 formed over a central portion of a substrate 202. The bottom gate 218 can include a suitable metal, such as a metal described with reference to top-gate 112. In the embodiment shown, the bottom gate 218 is formed on and contacting the substrate 202. In other embodiments, one or more intervening layers can be provided between substrate 202 and the bottom gate 218. A gate insulator layer 210 can further be provided over the bottom gate 218 and portions of the substrate 202 around the bottom gate 218. The ES-MO TFT further includes a MO active layer formed over a portion of the gate insulator layer 210 that is adjacent to the bottom gate 218. The MO active layer can be formed with a suitable oxide material, including one or more oxides described with reference to the MO active layer of TGSA-MO TFT 201. The MO active layer of the ES-MO TFT includes a channel region 204 that is formed directly above at least a portion of the bottom gate 218. Unlike the MO active layer of the TGSA-MO TFT 201, the MO active layer of the ES-MO TFT does not include the S/D regions 206 and 208. In particular, the ES-MO TFT 203, includes a source electrode 224 provided over a first portion of the MO active layer located on a first side of the MO channel region 204, and a drain electrode 226 provided over a second portion of the MO active layer located on a second side of the MO channel region 204. The source electrode 224 and the drain electrode 224 are unified structures that respectively serve as the transistor source and drain. The source electrode 224 and the drain electrode 226 can respectively be formed with a suitable conducting material having a low resistivity. For example, the source electrode 224 and the drain electrode 226 can be formed with conductive materials including but not limited to: one or more metals, one or more alloys, indium-tin-oxide (ITO), indium oxide, zinc oxide, tin oxide, aluminum-zinc-oxide (AZO), carbon nanotubes (CNT), graphene, conductive nanowire meshes, conductive polymers, poly-ethylenedioxythiophene, poly-ethylenedioxythiophene, poly-styrene-sulfonate, poly-dioctyl-cyclopentadithiophene. A passivation layer 214 can further be provided on and aligned with the MO channel region 204. With this embodiment, the passivation layer 214 can serve as an etch-stop during fabrication of the ES-MO TFT 203.

FIG. 2C presents a cross-sectional schematic of a EMMO TFT 205. The EMMO TFT can include a bottom gate 218 formed over a central portion of a substrate 202. The bottom gate 218 can include a suitable metal, such as a metal described with reference to top-gate 112. In the embodiment shown, the bottom gate 218 is formed on and contacting the substrate 202. In other embodiments, one or more intervening layers can be provided between substrate 202 and the bottom gate 218. A gate insulator layer can further be provided over the bottom gate 218 and portions of the substrate 202 around the bottom gate 218. The EMMO TFT further includes a MO active layer formed over a portion of the gate insulator layer 210 that is adjacent to the bottom gate 218. Unlike the ES-MO TFT 203, the MO active layer of the EMMO TFT 205 includes the MO source region 206, the MO channel region 204 and the MO drain region. The MO active layer of the EMMO TFT 205 can be formed with a suitable oxide material, including one or more oxides described with reference to the MO active layer of TGSA-MO TFT 201. The MO active layer of the EMMO TFT includes the MO channel region 204 formed directly above at least a portion of the bottom gate 218. In some implementations, the low resistivity's of the MO source region 206 and the MO drain region 208 can be developed using doping or the impermeable cover capping and thermal annealing process discussed with reference to the TGSA-MO TFT 201.

The EMMO TFT 205 can further include sealing electrodes 228 that are electrically connected to the MO source region 206 and the MO drain region 208. A passivation layer 214 can further be provided on and aligned with the MO active layer, including portions of the MO source region 206, the MO channel region 204 and the MO drain region 208. With this embodiment, the passivation layer 214 can also serve as an etch-stop during fabrication of the EMMO TFT 205. The sealing electrodes 228 facilitate formation of the conductive MO source region 206 and the MO drain region 208 in association with fabrication of the EMMO TFT 205 by serving as a gas-impermeable cover while the MO source 206 and the MO drain 208 are annealed. After annealing is complete and the MO source 206 and the MO drain 208 are formed with resistivities that are controlled based on the annealing with the gas-imperial covers formed thereon, the sealing electrodes 228 can provide the electrical connections to the MO source 206 and MO drain 208. In this regard, the sealing electrodes 228 can thus simultaneously serves as an electrical electrode and a gas seal. One or more suitable materials for the sealing electrode 228 that facilitates this dual functionalities can include but are not limited to: conductive sealing materials (one or more metals, alloys, conductive polymers, poly-ethylenedioxythiophene, poly-ethylenedioxythiophene, poly-styrene-sulfonate, poly-dioctyl-cyclopentadithiophene), or stacks of conductive materials (one or more metals, one or more alloys, indium-tin-oxide (ITO), indium oxide, zinc oxide, tin oxide, aluminum-zinc-oxide (AZO), carbon nanotubes (CNT), graphene, conductive nanowire meshes, conductive polymers, poly-ethylenedioxythiophene, poly-ethylenedioxythiophene, poly-styrene-sulfonate, poly-dioctyl-cyclopentadithiophene) and insulating seals (silicon, silicon nitride, silicon oxynitride, aluminum oxide, hafnium oxide, zirconia, titanium oxide, zirconium silicate, zirconium aluminate, gadolinium silicate, titanium silicate, graphene oxide, polyimide, polyester, polyethylene terephthalate, polyethylene naphthalate, polyether-ether-ketone, Polydimethylsiloxane).

With reference to FIGS. 1 and 2A-2C, MO TFTs (e.g., TGSA-MO TFT 201, ES-MO TFT 203, and EMMO TFT 205), and LTPS TFTs (e.g., LTPS TFT 101), are two mainstream technologies for high-resolution FPDs. The MO TFT and the LTPS TFT have differing benefits and drawbacks when applied to high-resolution FPDs. For example, the LTPS TFT exhibits larger mobility and thus better current drive capability over the MO TFT, and is also more reliable under stress. The LTPS TFT can also be made into both n-type and p-type, compatible with CMOSs, making it more suitable for circuit applications relative to the MO TFT. On the other hand, MO TFTs demonstrates good uniformity, low leakage current and are associated with a much lower fabrication cost. However, since most MO materials are n-type, the lack of PMOSs limits the properties of logic circuit fabrication based on MO TFTs.

FIGS. 3A-7B present new transistor structures that integrate an LTPS TFT (e.g., LTPS TFT 101) and a MO TFT (e.g., TGSA-MO TFT 201, ES-MO TFT 203, and EMMO TFT 205), in a single structure in a manner that provides the benefits of both the LTPS TFT and the MO TFT for application in high resolution displays while saving the layout area and reducing the pixel size of the active matrix display. These new transistor structures are referred to as metal-oxide on silicon (MOOS) transistor structures because they comprise a stacked configuration wherein the MO TFT is partially stacked on the Si-TFT. In particular, the disclosed MOOS transistor structures integrate the LTPS TFT 100 and either the TGSA-MO TFT 201, the ES-MO-TFT 203, or the EMMO-TFT 205 in a 3D stacked manner, by partially stacking a portion of the MO TFT over a portion of the LTPS TFT. The stacking is characterized as being 3D because the MO TFT is stacked over the LTPS TFT in a vertical direction, (as opposed to a planar arrangement wherein the respective TFTs are arranged on a same plane). In accordance with various embodiments of the MOOS transistor structures described herein, the manner in which the MO TFT is stacked over the LTPS TFT results in usage of the gate electrode, source region or drain region of one of the TFTs as the gate electrode for the other TFT.

Figure 3A:
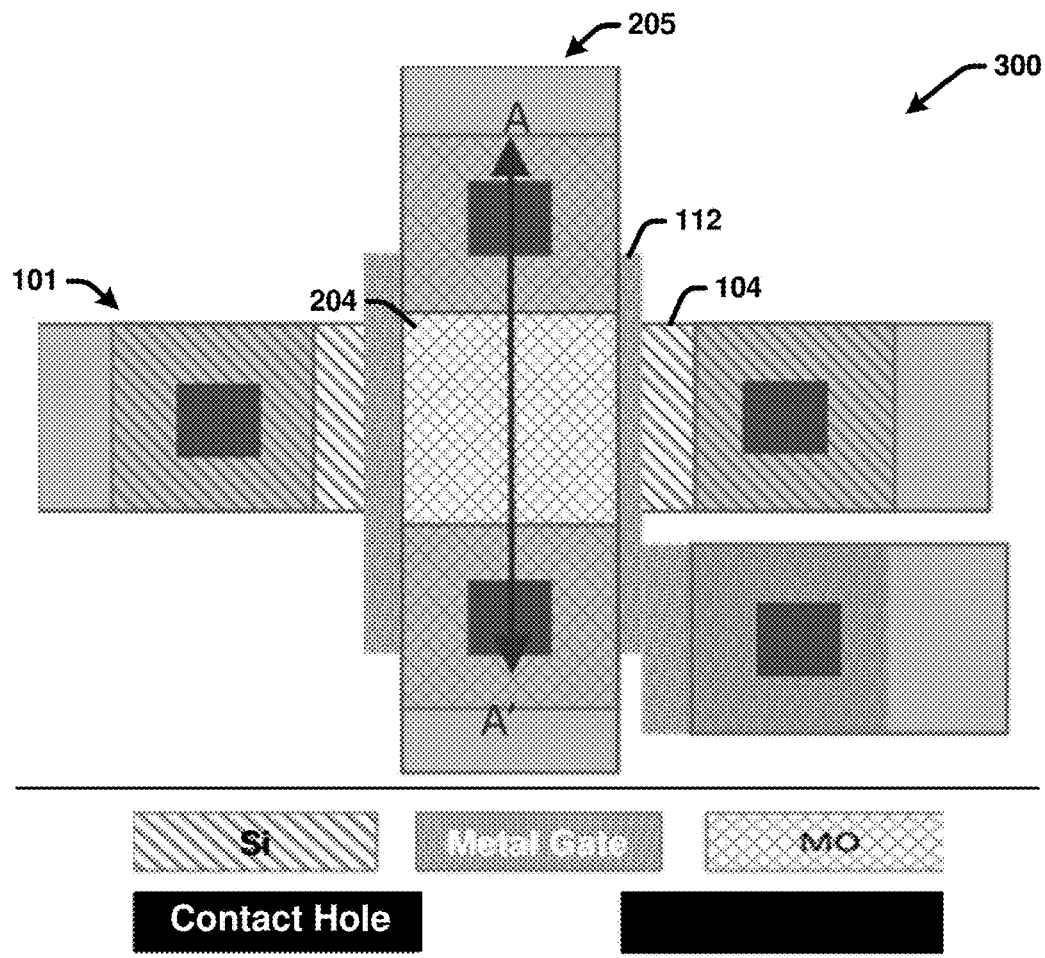
FIGS. 3A and 3B present different views of an example metal-oxide on silicon (MOOS) transistor structure in accordance with a first embodiment of the disclosed subject matter.
Figure 3B:
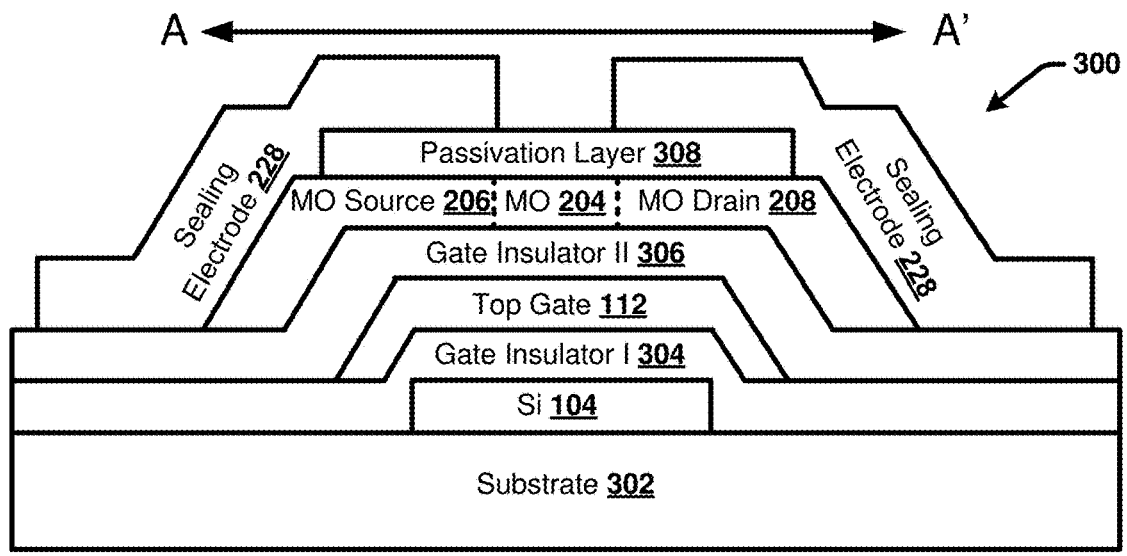

With reference now to FIGS. 3A and 3B, presented in an example MOOS transistor structure 300 in accordance with a first embodiment. FIG. 3A presents a top-down planar view of an example MOOS transistor structure 300. FIG. 3B presents a cross-sectional view of the example MOOS transistor structure 300 taken along axis A-A'. The MOOS transistor structure 300 vertically stacks one or more elements of the EMMO TFT 205 on the LTPS TFT 101. Repetitive description of like elements employed in respective embodiments is omitted for sake of brevity.

In accordance with the first embodiment, the MOOS transistor structure 300 employs the gate electrode of the LTPS TFT 101 as the gate electrode of the EMMO-TFT 205. In particular, in the MOOS transistor structure 300, the active layer (e.g., the channel region 204) of the EMMO TFT 205 is stacked directly over the top-gate 112 of the LTPS TFT 101. With these embodiments, the top-gate 112 of the LTPS TFT 100 can serve as both a top-gate electrode for the LTPS TFT and the bottom-gate electrode for the EMMO TFT 205. In this regard, the MOOS transistor structure 300 combines the LTPS TFT 101 and the EMMO TFT 205 in a vertical stacked manner wherein the respective TFTs share a single gate electrode. This stacking configuration can be used when the gate electrodes of Si and MO TFTs need to be connected, saving the layout area of contact holes and interconnection lines and thus enabling a high-ppi display when used in the display panel matrix.

For example, as shown in FIG. 3A, the LTPS TFT 101 is depicted with a horizontal orientation, wherein contact holes to the S/D regions (e.g., source region 106 and drain region 108) are respectively provided on the right and left sides of the central portion of the LTPS TFT 101. The central portion of the LTPS TFT 101 includes the Si channel region 104 and the top-gate 112. The EMMO TFT 205 is positioned with a vertical orientation, wherein contact holes to the S/D regions (e.g., source region 206 and drain region 208) are formed above and below the central portion of the EMMO TFT 205. The central portion of the EMMO TFT 205 includes the channel region 204 (and passivation layer 214 in some implementations). In this regard, the orientations of the LTPS TFT 101 and the EMMO TFT 205 as integrated in MOOS transistor structure 300 are perpendicular to one another. The overlapping central portions of the LTPS TFT 101 and the EMMO TFT 205 collectively include a single gate electrode (e.g., top-gate 112) sandwiched and shared between the Si-active layer (e.g., channel region 104) and the MO-active layer (e.g., channel region 204).

This shared gate structure is further exemplified in the cross-sectional view of the MOOS transistor structure 300 shown in FIG. 3B. The cross-sectional view shown in FIG. 3B is taken along the length of the EMMO TFT 205. In the embodiment shown, the cross-section of the MOOS transistor structure 300 along axis A-A' includes the Si channel region 104 formed on a substrate 302. Substrate 302 can correspond to substrate 102 or substrate 202. In this regard, the substrate 302 can include same or similar materials and functionality as substrate 102 or substrate 302. A first gate insulator layer I 304 can further be formed over the Si channel region 104. The gate insulator layer I 304 can be or include same or similar materials and functionality as gate insulator layer 110. The MOOS transistor structure 300 further includes the top-gate 112 formed directly over the Si channel region 104. A second gate insulator layer II 306 can further be formed over the top-gate 112 and the gate insulator layer I 304. The gate insulator layer I 304 can be or include same or similar materials and functionality as gate insulator layer 210. The MOOS transistor structure 300 further includes the MO active layer including the MO source region 206, the MO channel region 204 and the MO drain region 208. In the embodiment shown, the MO active layer is formed over the gate insulator layer II 306 such that the MO channel region 204 is formed directly over the top-gate 112. With this configuration, the top-gate 112 can serve as both the gate electrode for the Si channel region 104 of the LTPS TFT 101 and the gate electrode for the MO channel region 204 of the EMMO TFT 205.

As with the EMMO TFT 205 shown in FIG. 2C, the MO source region 206 and the MO drain region 208 can respectively be formed on either side of the MO channel region 204. The MOOS transistor structure 300 further includes a passivation layer 308 formed over the MO active layer. The passivation layer 308 can be or include same or similar materials as passivation layer 214. The MOOS transistor structure 300 also includes the sealing electrodes 228.

Figure 4A:
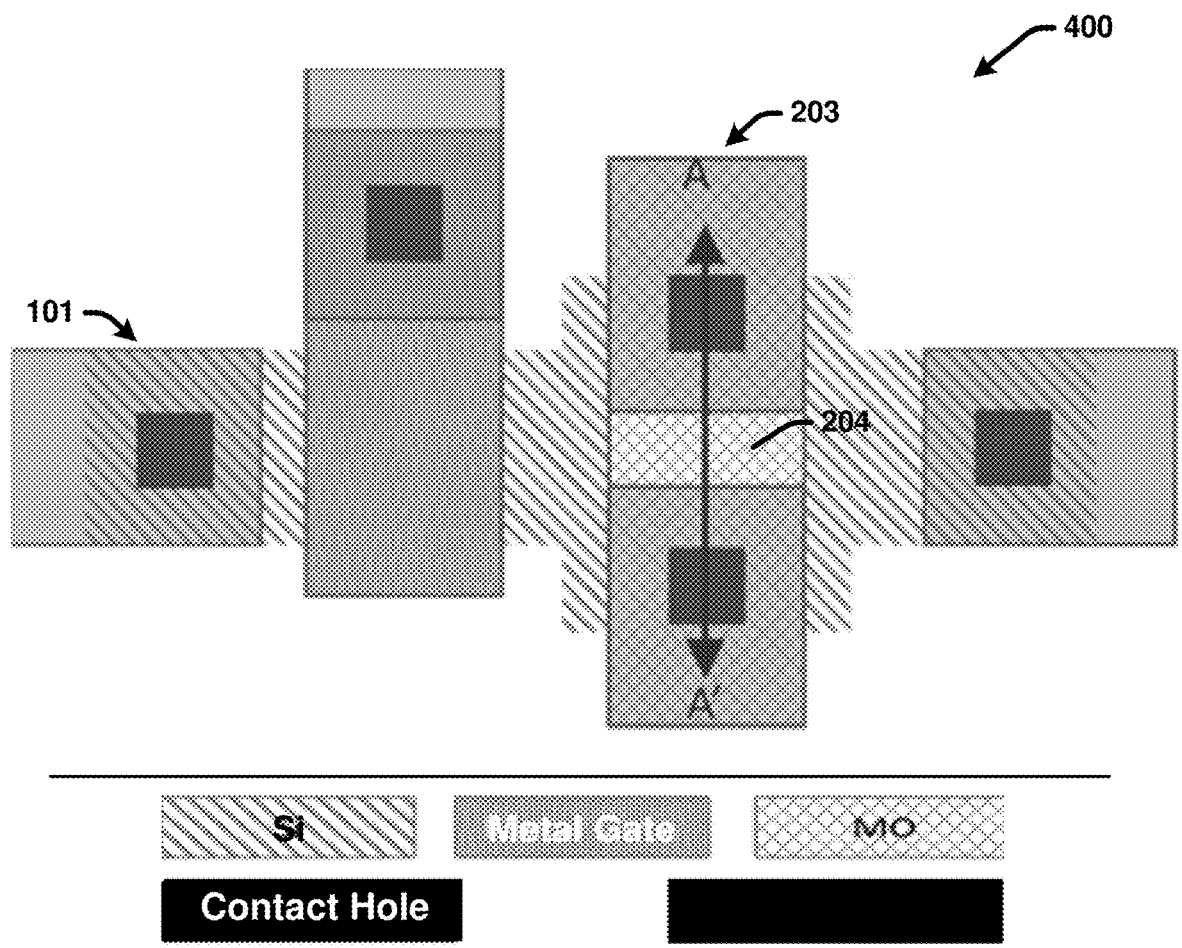
FIGS. 4A and 4B present different views of another example MOOS transistor structure in accordance with a second embodiment of the disclosed subject matter.
Figure 4B:
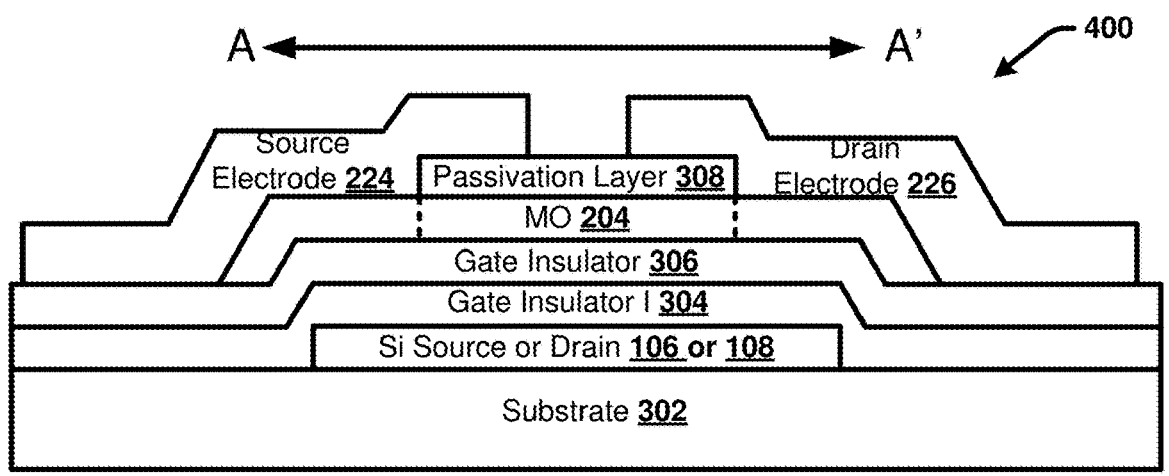

FIGS. 4A and 4B present another example MOOS transistor structure 400 in accordance with a second embodiment. FIG. 4A presents a top-down planar view of an example MOOS transistor structure 400. FIG. 4B presents a cross-sectional view of the example MOOS transistor structure 400 taken along axis A-A'. The MOOS transistor structure 400 vertically stacks one or more elements of the ES-MO TFT 203 on the LTPS TFT 101. Repetitive description of like elements employed in respective embodiments is omitted for sake of brevity.

In accordance with the second embodiment, the MOOS transistor structure 400 stacks the active layer of the ES-MO TFT 203 (e.g., the MO channel region 204 of the ES-MO TFT 203) directly over either the Si source region 106 or the Si drain region 108 of the LTPS TFT 101. With these embodiments, the Si source region 106 or the Si drain region 108 of the LTPS TFT can also serve as the bottom-gate electrode for the ES-MO TFT 203. This stacking configuration can be used when the source or drain of the Si-TFT needs to be connected to the gate of MO TFT, saving the layout area of contact holes and interconnection lines and thus enabling a high-ppi display when used in the display panel matrix.

For example, as shown in FIG. 4A, the LTPS TFT 101 is depicted with a horizontal orientation, wherein contact holes to the S/D regions (e.g., source region 106 and drain region 108) are respectively provided on the right and left sides of the LTPS TFT 101. The ES-MO TFT 203 is positioned with a vertical orientation, wherein contact holes to the S/D regions (e.g., source region 220 and drain region 222) are formed above and below the central portion of the ES-TFT 203. In this regard, the orientations of the LTPS TFT 101 and the ES-MO TFT 203 as integrated in MOOS transistor structure 400 are perpendicular to one another. In the embodiment shown, the MO channel region 204 of the ES-MO TFT is formed directly over either the Si source region 106 or the Si drain region. With this configuration, either the Si source region 106 or the Si drain region 108, (whichever is directly below the MO channel region 204 of the ES-MO TFT 203), can serve as the gate electrode for the ES-MO TFT 203.

This shared usage of the Si source region 106 or the Si drain region between the LTPS TFT 101 and the ES-MO TFT 203 is further exemplified in the cross-sectional view of the MOOS transistor structure 400 shown in FIG. 4B. The cross-sectional view shown in FIG. 4B is taken along the length of the ES-MO TFT 203. In the embodiment shown, the cross-section of the MOOS transistor structure 400 along axis A-A' includes either the Si source region 106 or the Si drain region 108 formed on a substrate 302. Substrate 302 can correspond to substrate 102 or substrate 202. A first gate insulator layer I 304 can further be formed over the Si source region 106 or the Si drain region 108. The MOOS transistor structure 400 can further include a second gate insulator layer II 306 formed over the first gate insulator layer 304. The MOOS transistor structure 400 can further includes the MO active layer including the MO channel region 204. In the embodiment shown, the MO channel region 204 is formed directly over the Si source region 106 or the Si drain region 108. With this configuration, the Si source region 106 or the Si drain region 108 (whichever is formed directly below the MO channel region 204), can serve as both a source or drain for the LTPS TFT 101 and the gate electrode for the MO channel region 204 of the ES-MO TFT 203.

As with the ES-MO TFT 203 shown in FIG. 2B, the source region 220 and the drain region 222 can respectively be formed above the MO active layer on either side of the MO channel region 204. The MOOS transistor structure 400 further includes a passivation layer 308 formed over the MO channel region 204, source electrode 224, and drain electrodes 226.

Figure 5A:
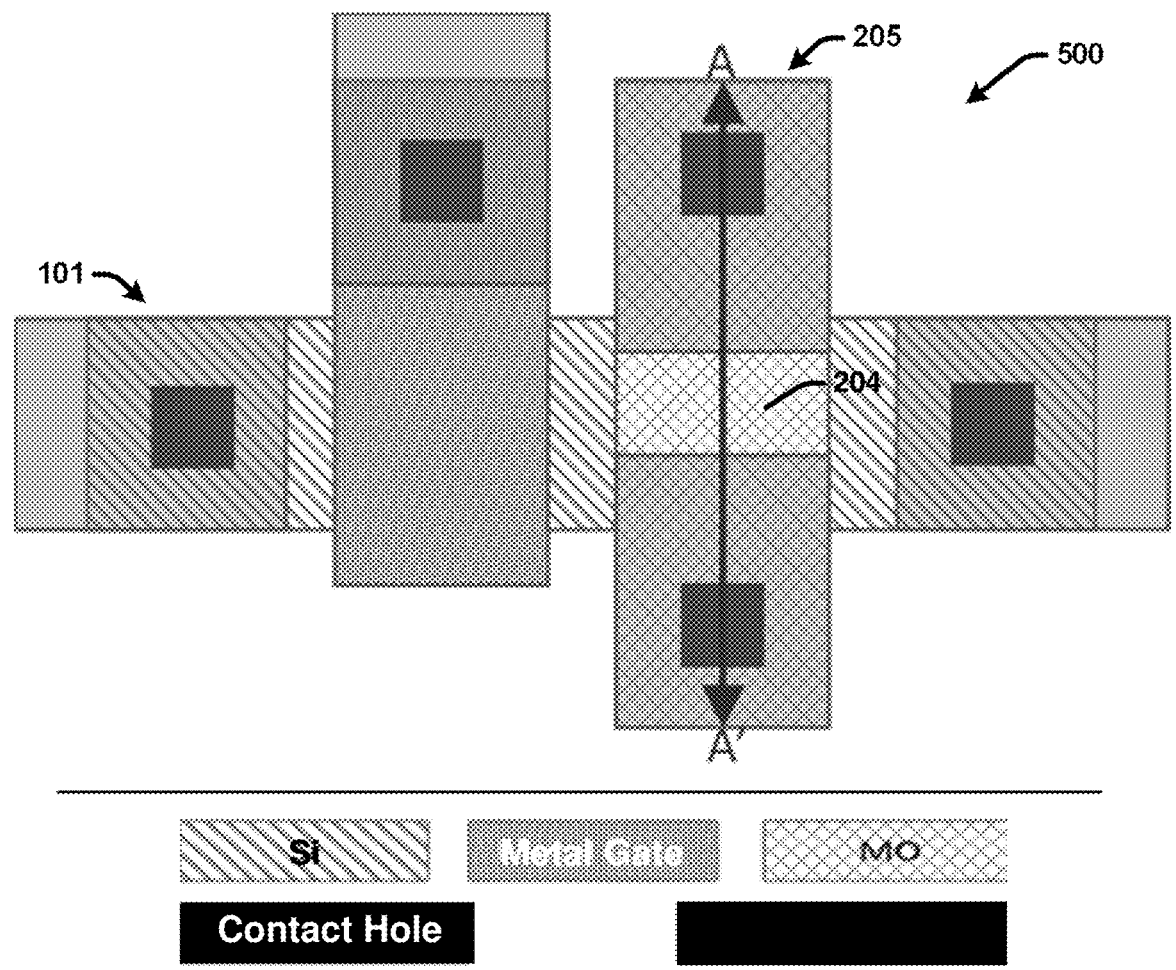
FIGS. 5A and 5B present different views of another example MOOS transistor structure in accordance with a third embodiment of the disclosed subject matter.
Figure 5B:
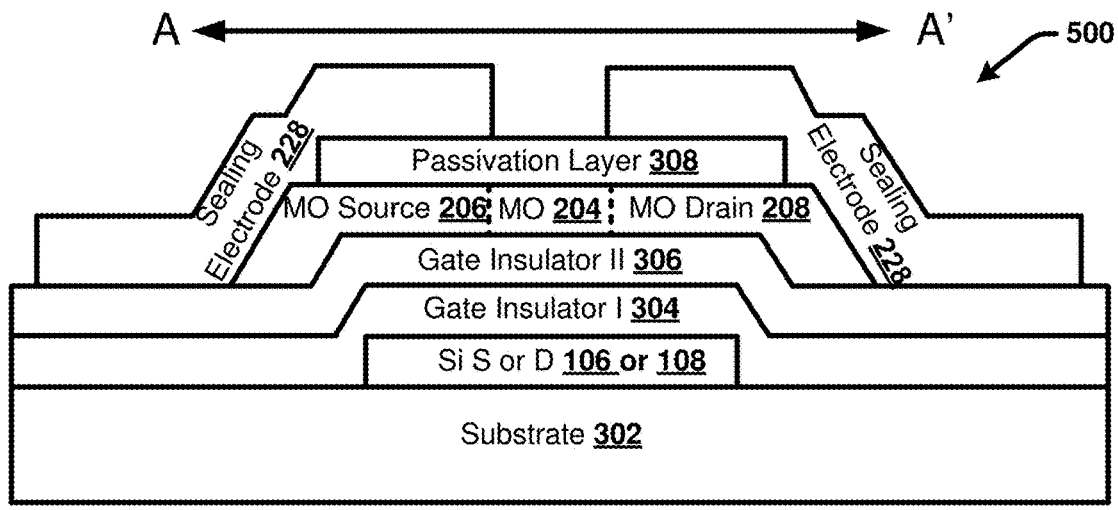

FIGS. 5A and 5B present another example MOOS transistor structure 500 in accordance with a third embodiment. FIG. 5A presents a top-down planar view of an example MOOS transistor structure 500. FIG. 5B presents a cross-sectional view of the example MOOS transistor structure 500 taken along axis A-A'. The MOOS transistor structure 500 vertically stacks one or more elements of the EMMO TFT 205 on the LTPS TFT 101. Repetitive description of like elements employed in respective embodiments is omitted for sake of brevity.

In accordance with the third embodiment, the MOOS transistor structure 500 stacks the active layer of the EMMO TFT 205 (e.g., the MO channel region 204 of the EMMO TFT 205) directly over either the Si source region 106 or the Si drain region 108 of the LTPS TFT 101. With these embodiments, the Si source region 106 or the Si drain region 108 of the LTPS TFT can also serve as the bottom-gate electrode for the EMMO TFT 205. This stacking configuration can be used when the source or drain of the Si-TFT needs to be connected to the gate of MO TFT, saving the layout area of contact holes and interconnection lines and thus enabling a high-ppi display when used in the display panel matrix.

For example, as shown in FIG. 5A, the LTPS TFT 101 is depicted with a horizontal orientation, wherein contact holes to the S/D regions (e.g., source region 106 and drain region 108) are respectively provided on the right and left sides of the LTPS TFT 101. The EMMO TFT 205 is positioned with a vertical orientation, wherein contact holes to the S/D regions (e.g., source region 206 and drain region 208) are formed above and below the central portion of the EMMO TFT 205. In this regard, the orientations of the LTPS TFT 101 and the EMMO TFT 205 as integrated in MOOS transistor structure 500 are perpendicular to one another. In the embodiment shown, the MO channel region 204 of the EMMO TFT is formed directly over either the Si source region 106 or the Si drain region 108. With this configuration, either the Si source region 106 or the Si drain region, (whichever is directly below the MO channel region 204 of the EMMO TFT 205), can serve as the gate electrode for the EMMO TFT 205.

This shared usage of the Si source region 106 or the Si drain region between the LTPS TFT 101 and the EMMO TFT 205 is further exemplified in the cross-sectional view of the MOOS transistor structure 500 shown in FIG. 5B. The cross-sectional view shown in FIG. 5B is taken along the length of the EMMO TFT 205. In the embodiment shown, the cross-section of the MOOS transistor structure 500 along axis A-A' includes either the Si source region 106 or the Si drain region 108 formed on a substrate 302. Substrate 302 can correspond to substrate 102 or substrate 202. A first gate insulator layer I 304 can further be formed over the Si source region 106 or the Si drain region 108. The MOOS transistor structure 500 can further includes a second gate insulator layer II 306 formed over the first gate insulator layer 304. The MOOS transistor structure 500 further includes the MO active layer, including the MO source region 206, the MO channel region 204 and the MO drain region 208. In the embodiment shown, the MO channel region 204 is formed directly over the Si source region 106 or the Si drain region 108. With this configuration, the Si source region 106 or the Si drain region 108 (whichever is formed directly below the MO channel region 204), can serve as both a source or drain for the LTPS TFT 101 and the gate electrode for the MO channel region 204 of the EMMO TFT 205.

As with the EMMO TFT 205 shown in FIG. 2C, the MO source region 206 and the MO drain region 208 can respectively be formed on either side of the MO channel region 204. The MOOS transistor structure 500 further includes a passivation layer 308 formed over the MO active layer and the sealing electrodes 228.

Figure 6A:
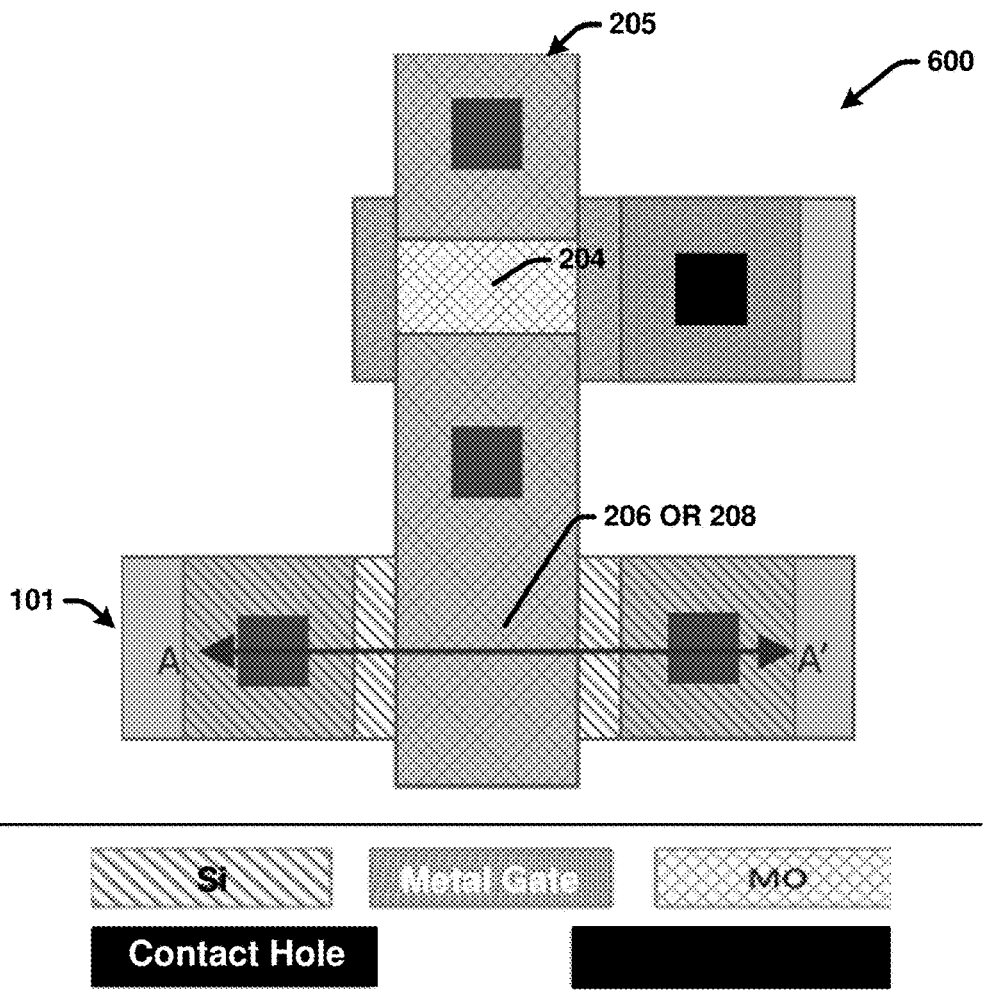
FIGS. 6A and 6B present different views of another example MOOS transistor structure in accordance with a fourth embodiment of the disclosed subject matter.
Figure 6B:
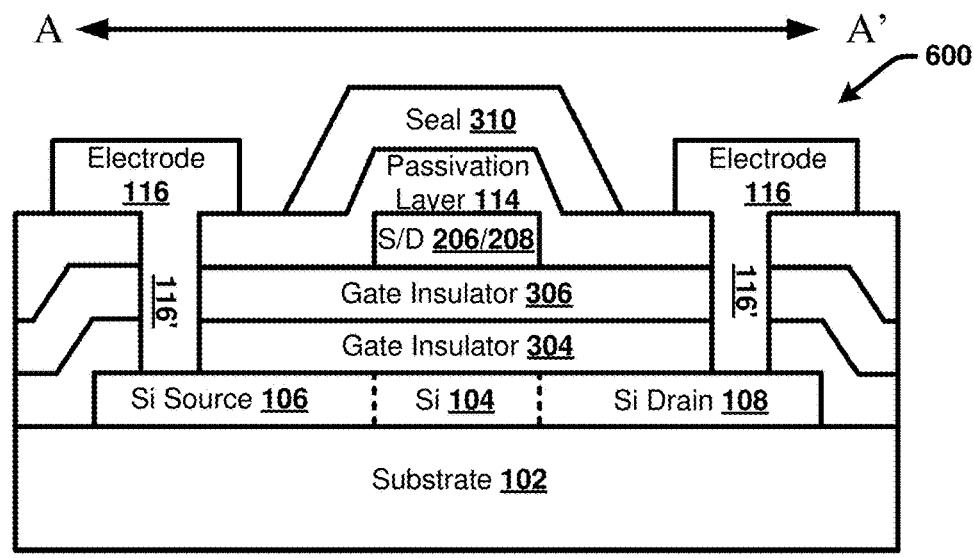

FIGS. 6A and 6B present another example MOOS transistor structure 600 in accordance with a fourth embodiment. FIG. 6A presents a top-down planar view of an example MOOS transistor structure 600. FIG. 6B presents a cross-sectional view of the example MOOS transistor structure 600 taken along axis A-A'. The MOOS transistor structure 600 vertically stacks one or more elements of the EMMO TFT 205 on the LTPS TFT 101. Repetitive description of like elements employed in respective embodiments is omitted for sake of brevity.

In accordance with the fourth embodiment, the MOOS transistor structure 600 stacks either the MO source region 206 or the MO drain region 208 of the EMMO TFT 205 directly over either the Si channel region 104 of the LTPS TFT 101. With this embodiment, the MO source region 206 or the MO drain region 208 of the EMMO TFT 205 can also serve as the top-gate electrode for the LTPS TFT 101. In some implementations of this fourth embodiment, the Si source region 106 and the Si drain region 108 of the LTPS TFT 101 are self-align implanted using the source region 206 or the drain region 208 (e.g., whichever is formed directly above the Si channel region 104) of the EMMO TFT 205 as the implantation mask. This stacking configuration can be used when the source or drain of the MO TFT needs to be connected to the gate of Si TFT, saving the layout area of contact holes and interconnection lines and thus enabling a high-ppi display when used in the display panel matrix.

For example, as shown in FIG. 6A, the LTPS TFT 101 is depicted with a horizontal orientation, wherein contact holes to the S/D regions (e.g., source region 106 and drain region 108) are respectively provided on the right and left sides of the LTPS TFT 101. The EMMO TFT 205 is positioned with a vertical orientation, wherein contact holes to the S/D regions are formed above and below the central portion of the EMMO TFT 205 including the MO channel region 204. In this regard, the orientations of the LTPS TFT 101 and the EMMO TFT 205 as integrated in MOOS transistor structure 600 are perpendicular to one another. In the embodiment shown, either the MO source region 206 or the MO drain region of the EMMO TFT is formed directly over the Si channel region 104 of the LTPS TFT 101. With this configuration, either the MO source region 206 or the MO drain region 208, (whichever is directly above the Si channel region 104 of the LTPS TFT 101) can serve as both an electrical source or drain for the EMMO TFT 205 and a top-gate electrode for the LTPS TFT 101.

This shared usage of the MO source region 206 or the MO drain region 208 between the LTPS TFT 101 and the EMMO TFT 205 is further exemplified in the cross-sectional view of the MOOS transistor structure 600 shown in FIG. 6B. The cross-sectional view shown in FIG. 6B is taken along the length of the LTPS TFT 101. In the embodiment shown, the cross-section of the MOOS transistor structure 600 along axis A-A' includes the Si active layer formed on the substrate 102. The Si active layer includes the Si source region 106, the Si channel region 104 and the Si drain region 108. A first gate insulator layer I 304 can further be formed over the Si active layer. The MOOS transistor structure 600 can further includes a second gate insulator layer II 306 formed over the first gate insulator layer 304. The MOOS transistor structure 600 further includes either the MO source region 206 or the MO drain region 208 formed directly over the Si channel region 104. With this configuration, the MO source region 206 or the MO drain region 208 (whichever is formed directly above the Si channel region 104), can serve as both a source or drain for the EMMO TFT 205 and a top-gate electrode for the LTPS TFT 101.

A passivation layer 114 can be formed over the MO source region 206 or the MO drain region 208 (whichever is used) and the gate insulator layer II 306. As with the LTPS TFT 101 shown in FIG. 1, contact holes 116' can be formed through the passivation layer 114 to the Si source region 106 and the Si drain region. The contact holes 116 and 116' can be filled with metal lines and electrically connected to electrodes 116. In some implementations, a gas-impermeable seal 310 can further be provided over the passivation layer 114. The gas-impermeable seal 310 can comprises one or more of the gas-impermeable materials discussed herein and facilitate forming the S/D regions 206/208 during annealing.

Figure 7A:
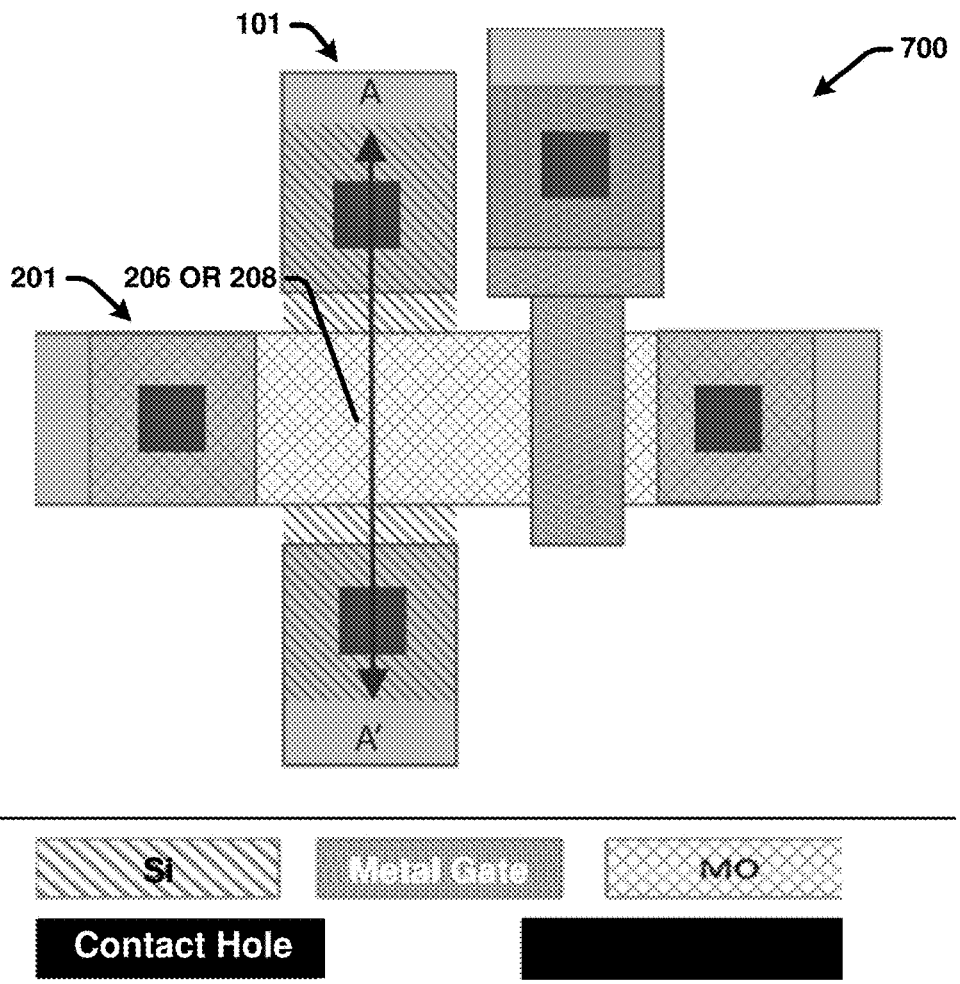
FIGS. 7A and 7B present different views of another example MOOS transistor structure in accordance with a fifth embodiment of the disclosed subject matter.
Figure 7B:
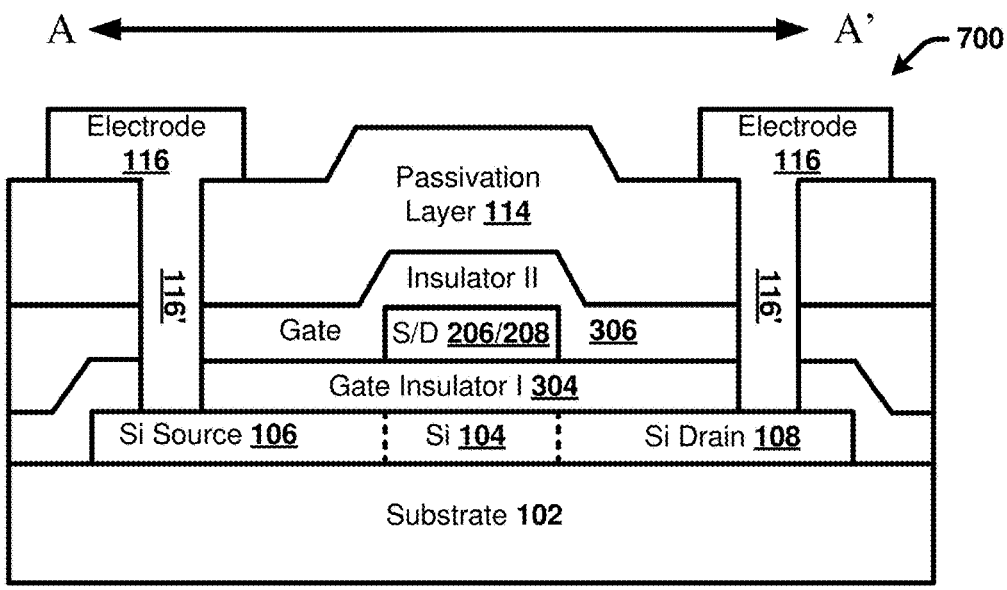

FIGS. 7A and 7B present another example MOOS transistor structure 700 in accordance with a fifth embodiment. FIG. 7A presents a top-down planar view of an example MOOS transistor structure 700. FIG. 7B presents a cross-sectional view of the example MOOS transistor structure 700 taken along axis A-A'. The MOOS transistor structure 700 vertically stacks one or more elements of the TGSA-MO TFT 201 on the LTPS TFT 101. Repetitive description of like elements employed in respective embodiments is omitted for sake of brevity.

In accordance with the fifth embodiment, the MOOS transistor structure 700 stacks either the MO source region 206 or the MO drain region 208 of the TGSA-MO TFT 201 directly over either the Si channel region 104 of the LTPS TFT 101. With this embodiment, the MO source region 206 or the MO drain region 208 of the TGSA-MO TFT 201 can also serve as the top-gate electrode for the LTPS TFT 101. In some implementations of this fifth embodiment, the Si source region 106 and the Si drain region 108 of the LTPS TFT 101 are self-align implanted using the source region 206 or the drain region 208 (e.g., whichever is formed directly above the Si channel region 104) of the TGSA-MO TFT 201 as the ion implantation mask. This stacking configuration can be used when the source or drain of the MO TFT needs to be connected to the gate of Si TFT, saving the layout area of contact holes and interconnection lines and thus enabling a high-ppi display when used in the display panel matrix.

For example, as shown in FIG. 7A, the LTPS TFT 101 is depicted with a vertical orientation, wherein contact holes to the S/D regions (e.g., source region 106 and drain region 108) are respectively above and below the central portion of the LTPS TFT 101, which includes the Si channel region 104. The TGSA-MO TFT 201 is positioned over the LTPS TFT 101 with a horizontal orientation, wherein contact holes to the S/D regions are formed on right and left sides of the central portion of the TGSA-MO TFT 201 including the MO channel region 204. In this regard, the orientations of the LTPS TFT 101 and the TGSA-MO TFT 201 as integrated in MOOS transistor structure 700 are perpendicular to one another. In the embodiment shown, either the MO source region 206 or the MO drain region of the TGSA-MO TFT 201 is formed directly over the Si channel region 104 of the LTPS TFT 101. With this configuration, either the MO source region 206 or the MO drain region 208, (whichever is directly above the Si channel region 104 of the LTPS TFT 101) can serve as both an electrical source or drain for the TGSA-MO TFT 201 and a top-gate electrode for the LTPS TFT 101.

This shared usage of the MO source region 206 or the MO drain region 208 between the LTPS TFT 101 and the TGSA-MO TFT 201 is further exemplified in the cross-sectional view of the MOOS transistor structure 700 shown in FIG. 7B. The cross-sectional view shown in FIG. 7B is taken along the length of the LTPS TFT 101. In the embodiment shown, the cross-section of the MOOS transistor structure 700 along axis A-A' includes the Si active layer formed on the substrate 102. The Si active layer includes the Si source region 106, the Si channel region 104 and the Si drain region 108. A first gate insulator layer I 304 can further be formed over the Si active layer. The MOOS transistor structure 700 further includes either the MO source region 206 or the MO drain region 208 formed on a portion of the first gate insulator layer I 304 that is directly over the Si channel region 104. With this configuration, the MO source region 206 or the MO drain region 208 (whichever is formed directly above the Si channel region 104), can serve as both a source or drain for the TGSA-MO TFT 201 and a top-gate electrode for the LTPS TFT 101. Further, in some implementations, the Si source region 106 and the Si drain region 108 can be formed via doping using the MO source region 206 or the MO drain region 208 (whichever is formed directly over the Si channel region 104) as a mask, resulting in self-aligned Si Source 106, Si drain 108 and Si channel regions 104. For example, in the embodiment shown, the Si channel region 104 is directly aligned under the MO S/D regions 206/208 and the Si source region 106 and the Si drain region are perfectly aligned with opposite sides of the MO S/D regions 206/208.

The MOOS transistor structure 700 can further include a second gate insulator layer II 306 formed over and around the MO source region 206 or the MO drain region 208. A passivation layer 114 can be formed over the second gate insulator layer II 306. As with the LTPS TFT 101 shown in FIG. 1, contact holes 116 and 116' can be formed through the passivation layer 114 to the Si source region 106 and the Si drain region. The contact holes 116 and 116' can be filled with metal lines and electrically connected to electrodes 116.

Figure 8:
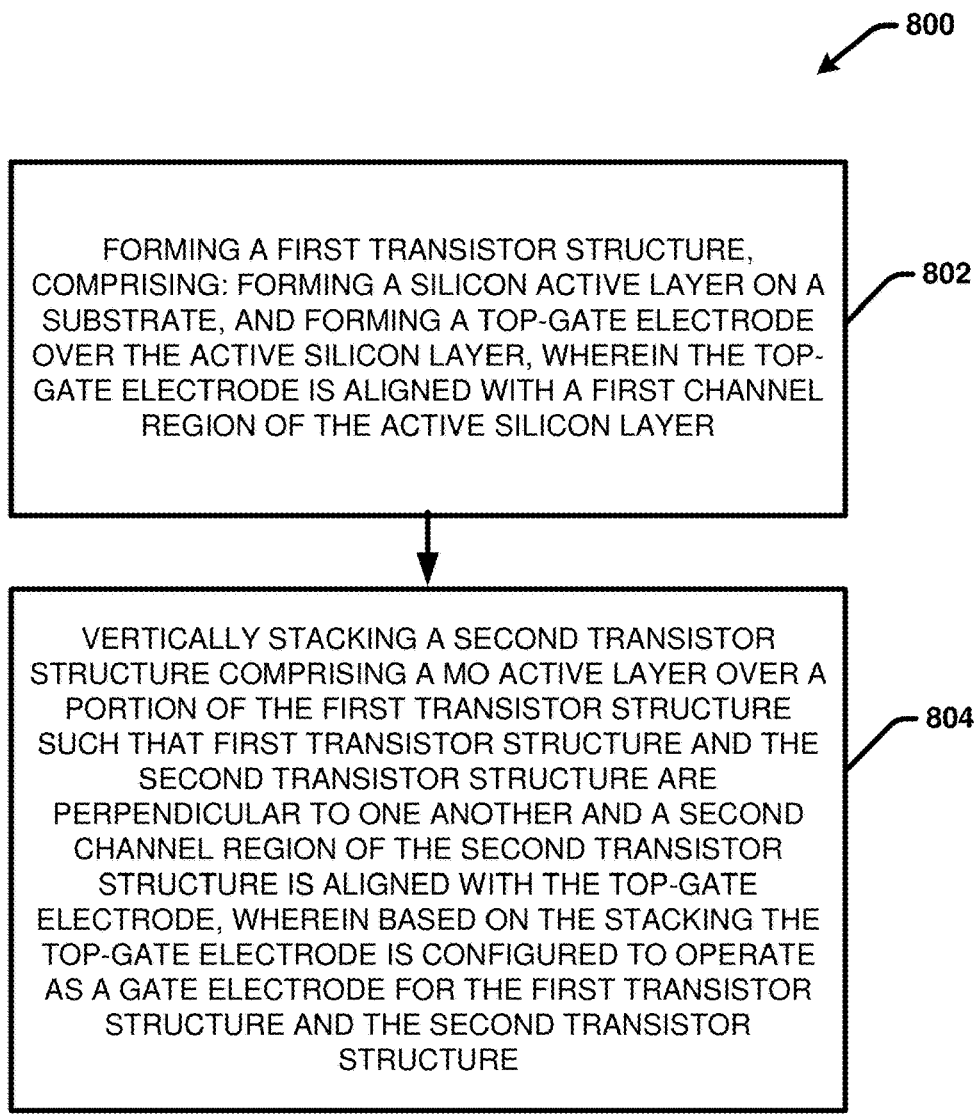
FIG. 8 presents a high-level flow diagram of an example process for fabricating a MOOS transistor structure in accordance with various aspects and embodiments of the disclosed subject matter.

FIG. 8 presents a high-level flow diagram of an example process 800 for fabricating a MOOS transistor structure in accordance with various aspects and embodiments so the disclosed subject matter. Process 800 can be employed in association with generating various types of MOOS transistor structures comprising a Si TFT and a MO TFT that share a gate electrode, such as MOOS transistor structure 300.

Repetitive description of like elements employed in respective embodiments is omitted for sake of brevity.

At 802, a first transistor structure is formed, comprising: forming a silicon active layer on a substrate, and forming a top-gate electrode over the active silicon layer, wherein the top-gate electrode is aligned with a first channel region of the active silicon layer. At 804, a second transistor structure comprising a MO active layer is vertically stacked over a portion of the first transistor structure such that first transistor structure and the second transistor structure are perpendicular to one another and a second channel region of the second transistor structure is aligned with the top-gate electrode, wherein based on the stacking the top-gate electrode is configured to operate as a gate electrode for the first transistor structure and the second transistor structure.

Figure 9:
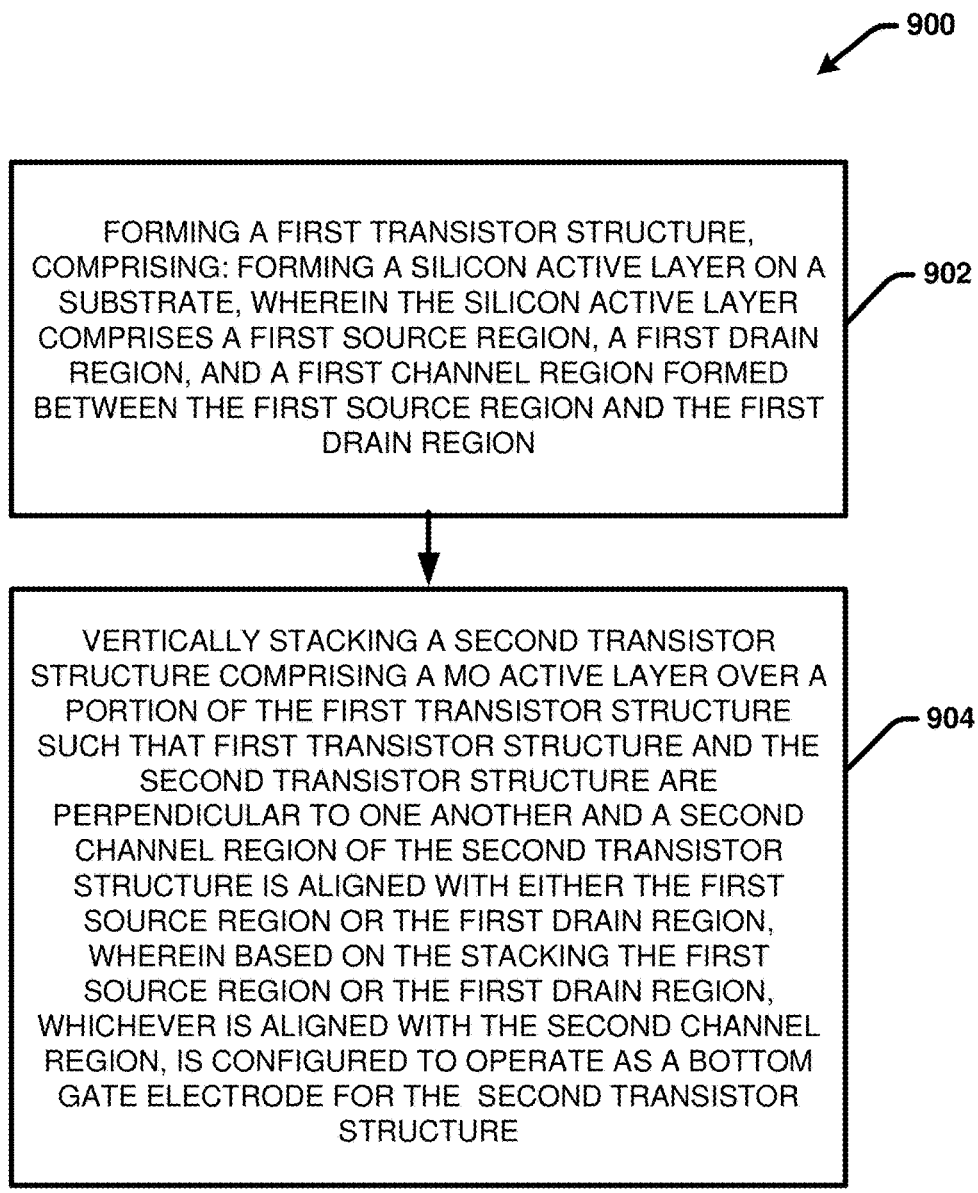
FIG. 9 presents a high-level flow diagram of another example process for fabricating a MOOS transistor structure in accordance with various aspects and embodiments of the disclosed subject matter.

FIG. 9 presents a high-level flow diagram of another example process 900 for fabricating a MOOS transistor structure in accordance with various aspects and embodiments so the disclosed subject matter. Process 900 can be employed in association with generating various types of MOOS transistor structures comprising a Si TFT and a MO TFT that employ a source or drain region of one TFT as the gate electrode for the other TFT, such as MOOS transistor structures 400 and 500. Repetitive description of like elements employed in respective embodiments is omitted for sake of brevity.

At 902, a first transistor structure is formed, comprising: forming a silicon active layer on a substrate, wherein the silicon active layer comprises a first source region, a first drain region, and a first channel region formed between the first source region and the first drain region. At 904, a second transistor structure comprising a MO active layer is vertically stacked over a portion of the first transistor structure such that first transistor structure and the second transistor structure are perpendicular to one another and a second channel region of the second transistor structure is aligned with either the first source region or the first drain region, wherein based on the stacking the first source region or the first drain region, whichever is aligned with the second channel region, is configured to operate as a bottom gate electrode for the second transistor structure.

Figure 10:
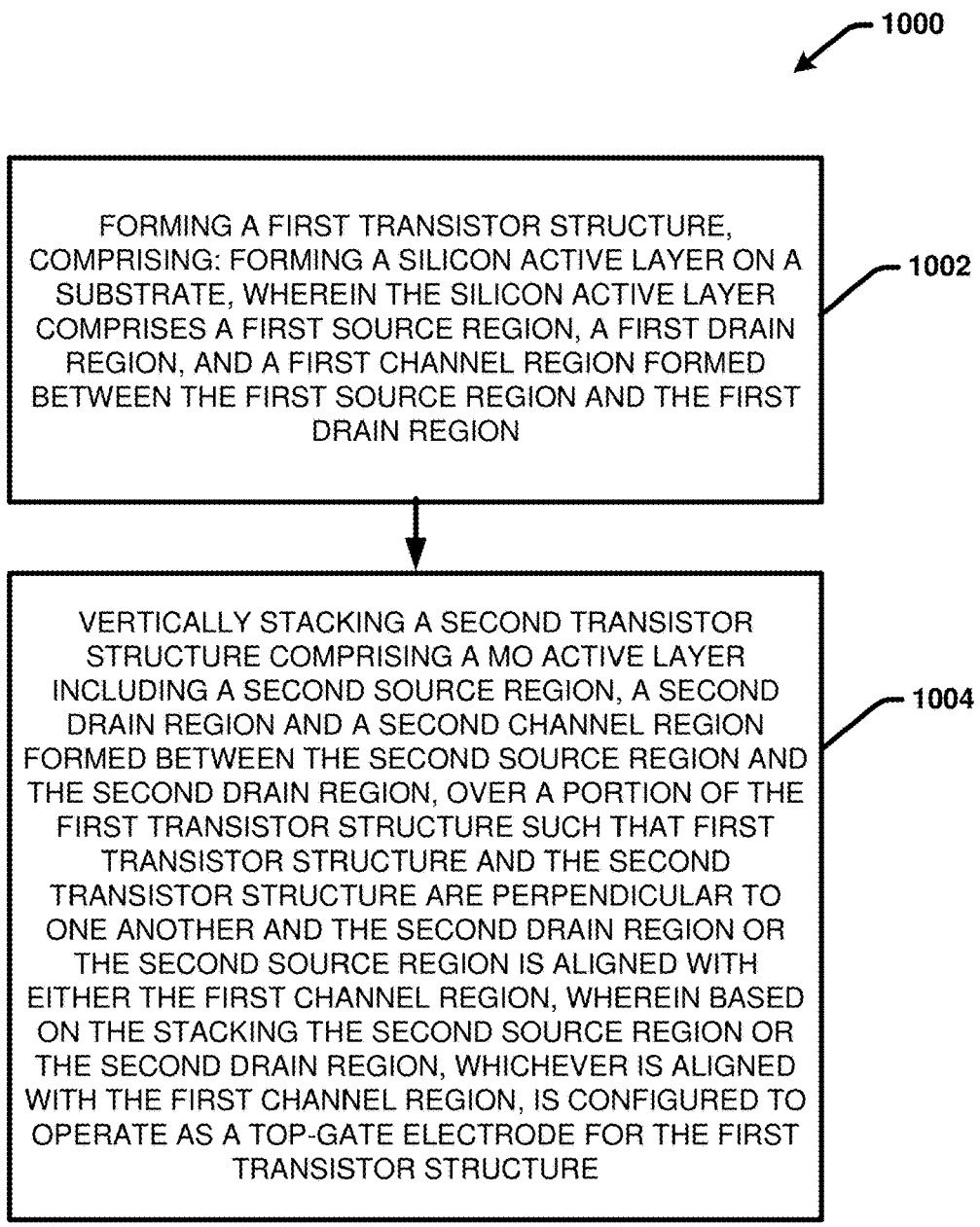
FIG. 10 presents a high-level flow diagram of another example process for fabricating a MOOS transistor structure in accordance with various aspects and embodiments of the disclosed subject matter.

FIG. 10 presents a high-level flow diagram of another example process 1000 for fabricating a MOOS transistor structure in accordance with various aspects and embodiments so the disclosed subject matter. Process 1000 can be employed in association with generating various types of MOOS transistor structures comprising a Si TFT and a MO TFT that employ a source or drain region of one TFT as the gate electrode for the other TFT, such as MOOS transistor structures 600 and 700. Repetitive description of like elements employed in respective embodiments is omitted for sake of brevity.

At 1002, a first transistor structure is formed, comprising: forming a silicon active layer on a substrate, wherein the silicon active layer comprises a first source region, a first drain region, and a first channel region formed between the first source region and the first drain region. At 1004, a second transistor structure comprising a MO active layer including a second source region, a second drain region and a second channel region formed between the second source region and the second drain region, is vertically stacked over a portion of the first transistor structure such that first transistor structure and the second transistor structure are perpendicular to one another and the second drain region or the second source region is aligned with either the first channel region, wherein based on the stacking the second source region or the second drain region, whichever is aligned with the first channel region, is configured to operate as a top-gate electrode for the first transistor structure.

Figure 11:
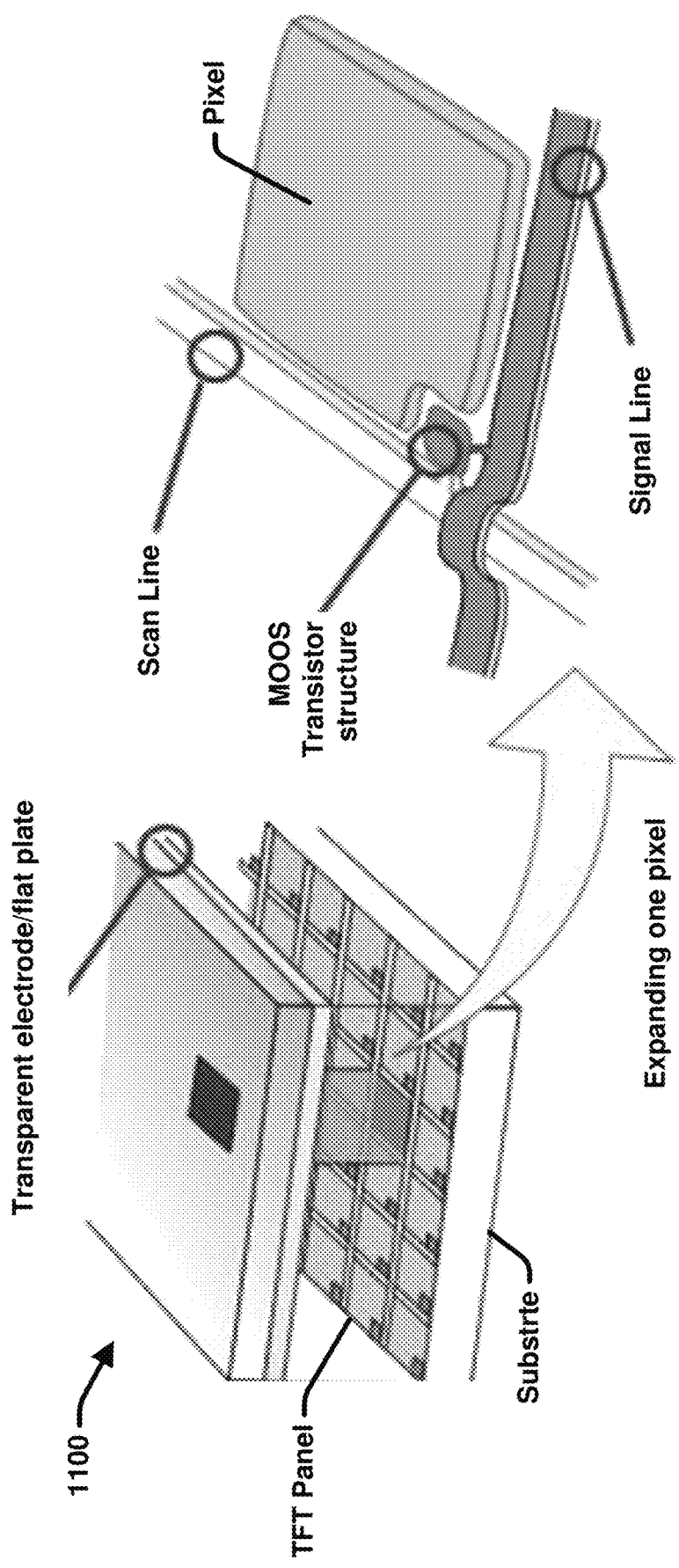
FIG. 11 presents an example FPD comprising MOOS transistor structures in accordance with various aspects and embodiments of the disclosed subject matter.

FIG. 11 presents an example FPD 1100 comprising MOOS transistor structures in accordance with various aspects and embodiments of the disclosed subject matter. The type of the FPD 1100 can vary. In some implementations, the FPD 1100 can be an OLED FPD. In another implementation, the FPD 1100 can be an AMOLED FPD. Other types of FPDs are envisioned. Repetitive description of like elements employed in respective embodiments is omitted for sake of brevity.

In various embodiments, the subject MOOS transistor structures, such as MOOS transistor structure 300, 400, 500, 600 and 700, can be employed as switches for respective pixels of a FPD, such as FPD 1100, to generate high resolution displays (e.g., with resolutions greater than 1000 ppi) with enhanced operational efficiency at low cost. In particular, because the subject MOOS transistors structures include both a LTPS TFT and a MO TFT, the subject transistor structures combine the benefits of both technologies and enable a 2T1C arrangement for each of the respective pixels. In this regard, with both with p-type LTPS and n-type MO TFTs, the subject MOOS transistor structures can be implemented as a CMOS circuit. Based on the role of TFTs in the display backplane, a proper choice of TFT type will also maximize the circuit performance. For example, when a large driving current is needed, an LTPS TFT will be placed, while for nodes needing low leakage current, MO TFTs are more suitable. In addition, when used as the pixel switches in FPDs, the subject MOOS transistor structures decrease the entire circuit area required for 2T1C switches because the MO TFT is partially stacked over the LTPS TFT, which reduces the total area of the combined TFTs and also reduces the number of contact holes required. This improved layout efficiency enables the generation of high-ppi displays under the existing FPD design rules, which allow a minimum photolithography size of 2.0 micrometers (μm) and a minimum transistor width to length ratio of 2.0 μm/2.0 μm.

FPD 1100 presents an exemplary FPD that reaps the many benefits of the subject MOOS transistor structures through the usage of the MOOS transistor as the pixel TFT. In particular, the FPD 1100 can include a TFT panel formed on a substrate. The TFF panel comprises a plurality of pixels that are each electrically connected to a MOOS transistor structure. The MOOS transistor structure can include for example, MOOS transistor structure 300, MOOS transistor structure 400, MOOS transistor structure 500, MOOS transistor structure 600, MOOS transistor structure 700, and the like. Due to the layout efficiency of the MOOS transistor structure used for each pixel, the entire pixel circuit area of the TFT panel can include more than 1000 ppi under the existing FPD design rules, which allow a minimum photolithography size of 2.0 micrometers (μm) and a minimum transistor width to length ratio of 2.0 μm/2.0 μm.

In addition to being used as the pixel ON/OFF switch for respective pixels of a FPD, (thereby enabling high resolution displays or displays with high ppi), the subject MOOS transistor structures can also be employed for various other electrical functions. For example, in some implementations, the subject MOOS transistor structures can be employed on the panel driver circuit of the FPD 1100, as well as on circuits for various other types of devices in addition to FPDs.

Figure 12:
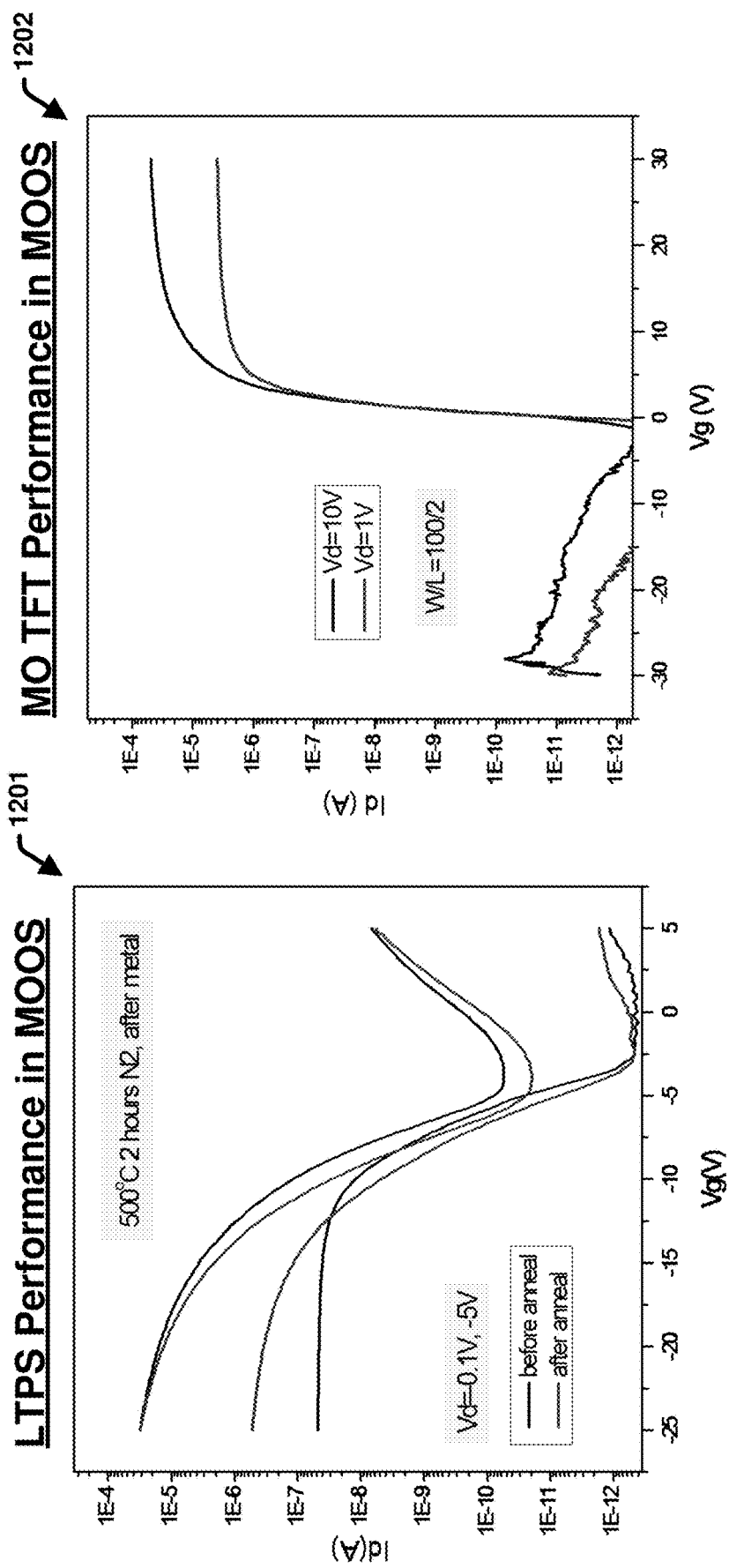
FIG. 12 presents graphs demonstrating the performance characteristics of the LTPS TFT and the MO TFT of an example MOOS transistor structure in accordance with various aspects and embodiments of the disclosed subject matter.

FIG. 12 presents graphs 1201 and 1202 demonstrating the performance characteristics of the LTPS TFT and the MO TFT of an example MOOS transistor structure in accordance with various aspects and embodiments of the disclosed subject matter. The MOOS transistor structures represented by graphs 1201 and 1202 can include any of the MOOS transistor structures described herein (e.g., MOOS transistor structures 300, 400, 500, 600 and 700). In this regard, regardless of the shared component arrangement of the LTPS relative to the MO TFT (e.g., usage of the top-electrode of the LTPS as the bottom electrode of the MO TFT, usage of either the Si source or drain of the LTPS as the gate electrode of the MO TFT, or usage of the MO source or drain of the MO TFT as the gate electrode of the LTPS), as shown in graph 1201 and 1202, both of kinds of the TFT exhibit exceptional performance.

Figure 13:
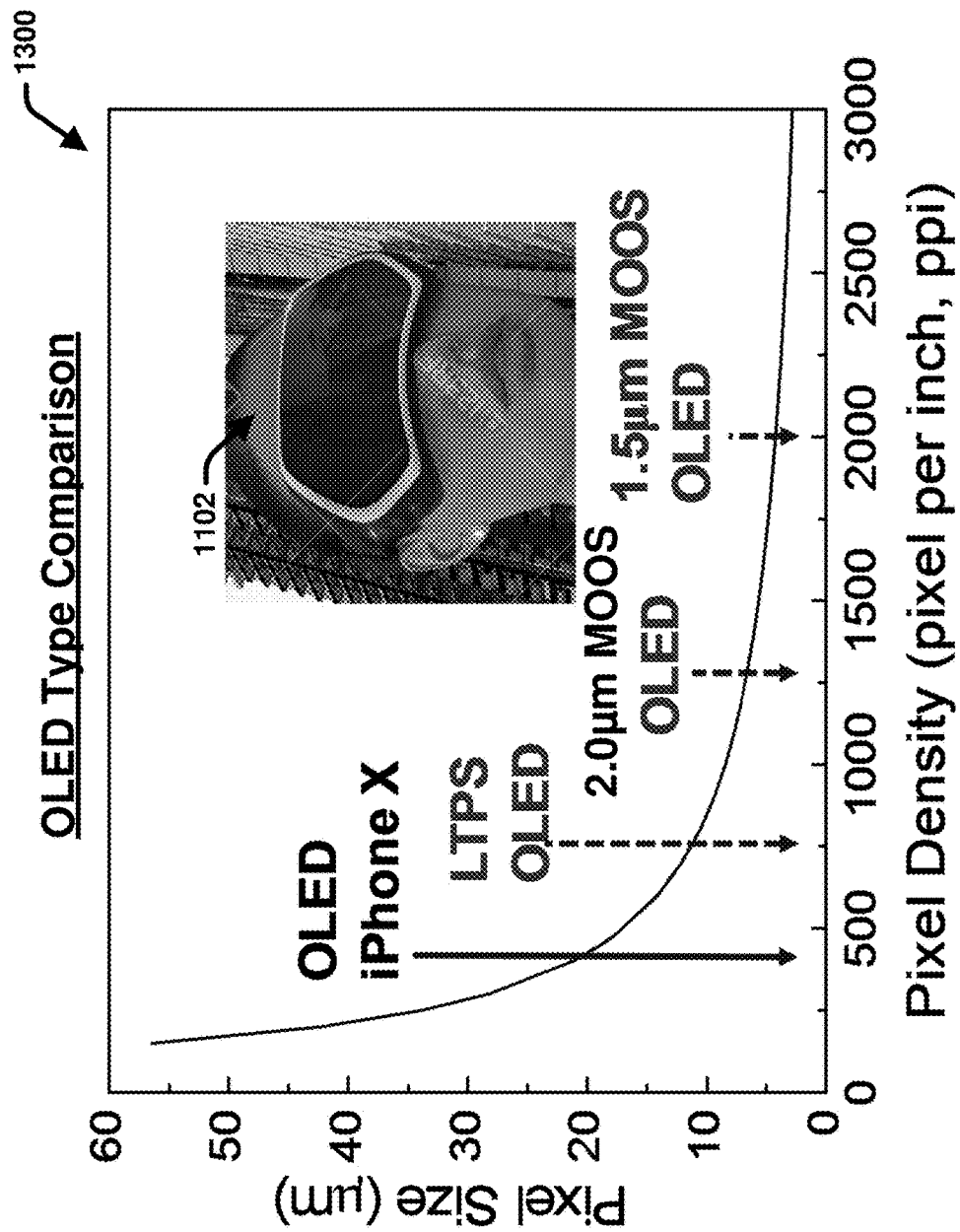
FIG. 13 presents a chart comparing average pixel density associated with different types of OLEDs in accordance with various aspects and embodiments of the disclosed subject matter.

FIG. 13 presents a chart 1300 comparing average pixel density associated with different types of OLEDs in accordance with various aspects and embodiments of the disclosed subject matter. As shown in chart 1300, the OLED FTPs using the subject MOOS transistor structures can achieve a much higher pixel density relative existing OLED FTPs. For example, MOOS OLEDs with a 2.0 μm photolithography resolution can achieve a pixel density of about 1250 ppi while, MOOS OLEDs with a 1.5 μm photolithography resolution can achieve a pixel density of about 2000 ppi.

Figure 14B:
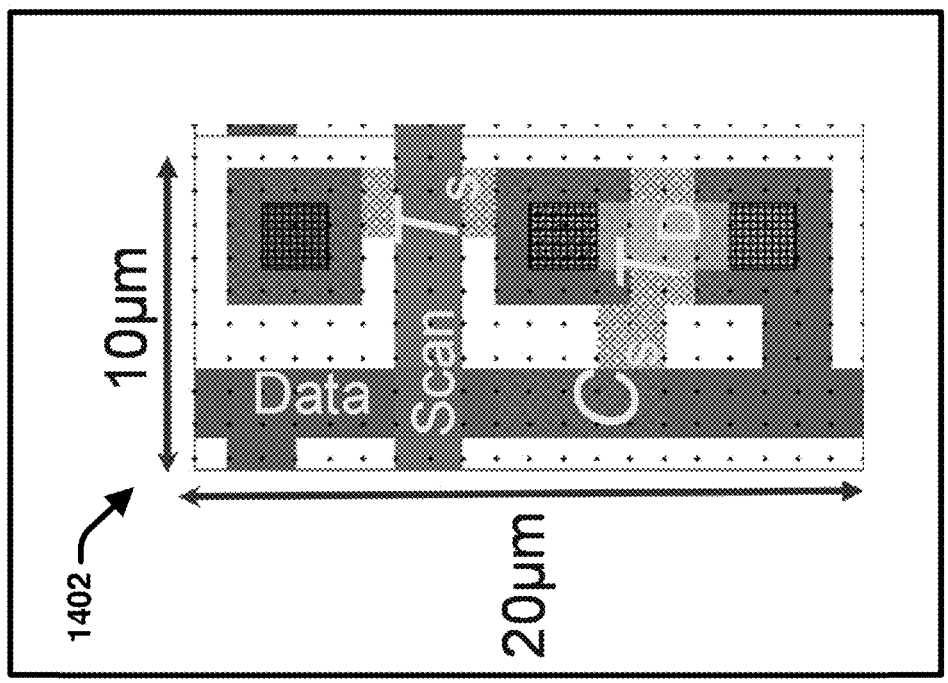
FIG. 14B presents an example circuit diagram of a MOOS transistor structure with vertical integration of a LTPS TFT and an MO TFT in accordance with various aspects and embodiments of the disclosed subject matter.
Figure 14A:
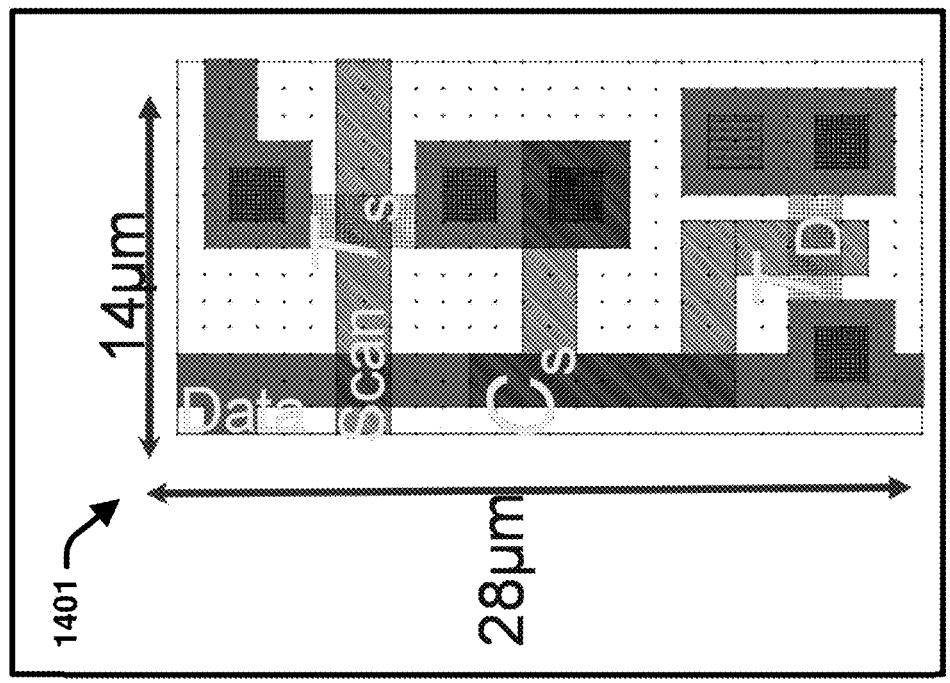
FIG. 14A presents an example circuit diagram of a transistor structure with planar integration of a LTPS TFT and an MO TFT.

FIG. 14A presents an example circuit diagram of a planar transistor structure with planar integration of a LTPS TFT and an MO TFT, and FIG. 14B presents an example circuit diagram of a MOOS transistor structure 1402 (e.g., MOOS transistor structures 300, 400, 500, 600 and 700) with vertical integration of a LTPS TFT and an MO TFT. As exemplified via the comparison of planar transistor structure 1401 and MOOS transistor structure 1402, the MOOS transistor structure significantly decreases the overall circuit area (e.g., width and length) utilized for both TFTs relative to the planar transistor structure 1401.

Figure 15:
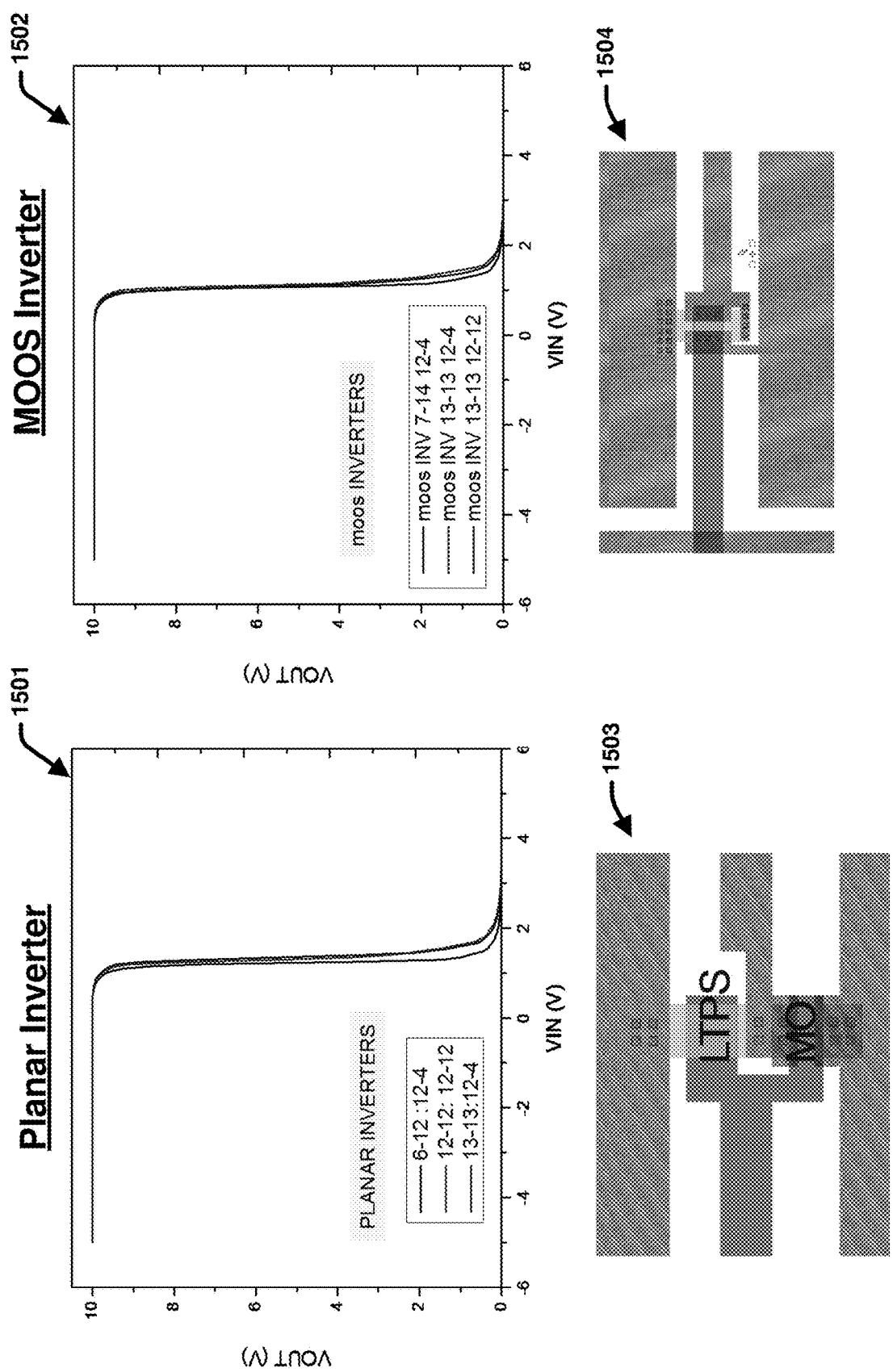
FIG. 15 presents graphs demonstrating the performance characteristics of a planar inverter and an example MOOS inverter in accordance with various aspects and embodiments of the disclosed subject matter.

FIG. 15 presents graphs 1501 and 1502 demonstrating the performance characteristics of a planar inverter (e.g., planar transistor structure 1401) and an example MOOS inverter (e.g., MOOS transistor structures 300, 400, 500, 600 and 700) in accordance with various aspects and embodiments of the disclosed subject matter. The physical layout and associated circuit areas of the respective inverters are shown below, wherein inverter 1503 corresponds to the planar inverter and inverter 1504 corresponds to the MOOS inverters. As can be seen via the comparison of graphs 1501 and 1502, both the planar inverter 1503 and the MOOS inverter 1504 exhibit the same performance characteristics while the MOOS inverter requires a substantially smaller circuit area.

Figure 16:
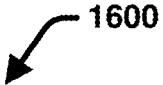
FIG. 16 presents a table comparing the performance characteristics of a planar inverter and an example MOOS inverter in accordance with various aspects and embodiments of the disclosed subject matter.

FIG. 16 presents a table 1600 comparing the performance characteristics of a planar inverter (e.g., planar transistor structure 1401) and an example MOOS inverter (e.g., MOOS transistor structures 300, 400, 500, 600 and 700) in accordance with various aspects and embodiments of the disclosed subject matter. As shown in table 1600, both inverters exhibit substantially the same oscillating frequency, delay per stage, output H and output L, despite the MOOS inverter requiring substantially less circuit area, thereby enabling FPD with high ppi (e.g., greater than 1000) that can also have the performance characteristics depicted in table 1600.

What has been described above includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described in this disclosure for illustrative purposes, various modifications are possible that are considered within the scope of such embodiments and examples, as those skilled in the relevant art can recognize.

In this regard, with respect to any figure or numerical range for a given characteristic, a figure or a parameter from one range may be combined with another figure or a parameter from a different range for the same characteristic to generate a numerical range. Other than in the operating examples, or where otherwise indicated, all numbers, values and/or expressions referring to quantities of ingredients, reaction conditions, etc., used in the specification and claims are to be understood as modified in all instances by the term "about."

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Moreover, the words "example" or "exemplary" are used in this disclosure to mean serving as an example, instance, or illustration. Any aspect or design described in this disclosure as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. An apparatus, comprising:
    a first transistor comprising a silicon active layer, wherein the silicon active layer comprises a source region, a drain region, and a channel region formed between the source region and the drain region; and
    a second transistor comprising a metal oxide active layer comprising a metal oxide channel, wherein the metal oxide channel is vertically stacked on either the source region or the drain region, and wherein either the source region or the drain region serves as a bottom gate for the second transistor.

2. The apparatus of claim 1, wherein, based on the metal oxide channel being vertically stacked on the source region, the source region is configured to operate as both an electrical source for the first transistor and the bottom gate for the second transistor.

3. The apparatus of claim 1, wherein, based on the metal oxide channel being vertically stacked on the drain region, the drain region is configured to operate as both an electrical drain for the first transistor and the bottom gate for the second transistor.

4. The apparatus of claim 1, wherein the first transistor comprises a low-temperature polysilicon (LTPS) thin-film transistor (TFT).

5. The apparatus of claim 1, wherein the second transistor comprises a metal oxide (MO) thin-film transistor (TFT).

6. The apparatus of claim 1, wherein the second transistor comprises an elevated-metal metal oxide (EMMO) thin-film transistor (TFT).

7. The apparatus of claim 1, wherein the second transistor comprises an etch-stop, metal oxide, thin-film transistor (ES-MO TFT).

8. The apparatus of claim 1, wherein the channel region and the metal oxide channel region do not overlap.

9. An apparatus, comprising:
    a first transistor comprising a silicon active layer, wherein the silicon active layer comprises a first source region, a first drain region, and a first channel region formed between the first source region and the first drain region; and
    a second transistor comprising a metal oxide active layer, a second source region and a second drain region, wherein either the second source region or the second drain region is vertically stacked on the first channel region, and wherein either the second source region or the second drain region serves as a top gate for the first transistor.

10. The apparatus of claim 9, wherein, based on the second source region being vertically stacked on the first channel region, the second source region is configured to operate as both an electrical source for the second transistor and the top gate for the first transistor.

11. The apparatus of claim 9, wherein, based on the second drain region being vertically stacked on the first channel region, the second drain region is configured to operate as both an electrical drain for the second transistor and the top gate for the first transistor.

12. The apparatus of claim 9, wherein the first transistor comprises a low-temperature polysilicon (LTPS) thin-film transistor (TFT).

13. The apparatus of claim 9, wherein the second transistor comprises a metal oxide (MO) thin-film transistor (TFT).

14. The apparatus of claim 9, wherein the second transistor comprises an elevated-metal metal oxide (EMMO) thin-film transistor (TFT).

15. The apparatus of claim 9, wherein the first source region and the first drain region are self-aligned relative to the second source region or the second drain region based on doping of the first source region and the first drain region using the second source region or the second drain region as a mask.

16. The apparatus of claim 9, wherein the second transistor comprises a top-gate self-aligned (TSGA) thin-film transistor (TFT).

17. The apparatus of claim 9, wherein the metal oxide active layer comprises the second source region, the second drain region, a second channel region formed between the second source region and the second drain region, wherein one of the second source region or the second drain region is formed between the first source region and the first drain region, and wherein the first channel region and the second channel region do not overlap.

18. An apparatus, comprising:
    a first transistor comprising a silicon active layer, wherein the silicon active layer comprises a first source region, a first drain region, and a first channel region formed between the first source region and the first drain region; and
    a second transistor comprising a metal oxide active layer, wherein the metal oxide active layer comprises a second source region, a second drain region, and a second channel region formed between the second source region and the second channel region,
    wherein the first transistor and the second transistor are stacked; and
    wherein either the first source region or the first drain region serves as a bottom gate for the second transistor, or
    wherein either the second source region or the second drain region serves as a top gate for the first transistor.

19. The apparatus of claim 18, wherein the first transistor and the second transistor are stacked with orientations perpendicular to one another and wherein the first channel region and the second channel region do not overlap.

20. The apparatus of claim 18, wherein the second transistor is selected from a group consisting of: a top-gate self-aligned thin-film transistor (TSGA-TFT), an elevated metal oxide thin-film transistor (EMMO-TFT), and an etch-stop, metal oxide, thin-film transistor (ES-MO TFT).

* * * * *